United States Patent
Hirano et al.

(10) Patent No.: US 10,747,081 B2
(45) Date of Patent: Aug. 18, 2020

(54) THIN-FILM TRANSISTOR, THIN-FILM TRANSISTOR SUBSTRATE, AND LIQUID CRYSTAL DISPLAY DEVICE

(71) Applicant: Mitsubishi Electric Corporation, Chiyoda-ku (JP)

(72) Inventors: Rii Hirano, Tokyo (JP); Kazunori Inoue, Kumamoto (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/077,630

(22) PCT Filed: Dec. 13, 2016

(86) PCT No.: PCT/JP2016/086976
§ 371 (c)(1),
(2) Date: Aug. 13, 2018

(87) PCT Pub. No.: WO2017/158967
PCT Pub. Date: Sep. 21, 2017

(65) Prior Publication Data
US 2019/0072797 A1    Mar. 7, 2019

(30) Foreign Application Priority Data
Mar. 18, 2016 (JP) ................. 2016-054856

(51) Int. Cl.
*G02F 1/1368* (2006.01)
*G02F 1/1343* (2006.01)
(Continued)

(52) U.S. Cl.
CPC ...... *G02F 1/1368* (2013.01); *G02F 1/134309* (2013.01); *H01L 21/8236* (2013.01);
(Continued)

(58) Field of Classification Search
CPC ............... H01L 27/1225; H01L 27/124; H01L 27/1288; H01L 27/3262; H01L 27/3244;
(Continued)

(56) References Cited

U.S. PATENT DOCUMENTS 9,543,325 B2 *  1/2017  Choi ................... H01L 27/1222
2010/0032679 A1 *  2/2010  Kawae ................ H01L 27/1214
257/72
(Continued)

FOREIGN PATENT DOCUMENTS

JP       2011-100997 A    5/2011
JP       2011-119518 A    6/2011
(Continued)

OTHER PUBLICATIONS

International Search Report dated Mar. 7, 2017 in PCT/JP2016/086976 filed Dec. 13, 2016.
(Continued)

*Primary Examiner* — Thoi V Duong
(74) *Attorney, Agent, or Firm* — Xsensus LLP

(57) ABSTRACT

A TFT in which a channel region is formed of an oxide semiconductor is provided. Threshold voltage shift due to holes photoexcited in the vicinity of a source electrode and a drain electrode is prevented so that reliability is enhanced. A lower semiconductor layer is partially provided between an oxide semiconductor layer and a gate insulating film. The lower semiconductor layer is present in at least one of a source overlapping region where the oxide semiconductor layer overlaps a source electrode and a drain overlapping region where the oxide semiconductor layer overlaps a drain electrode. In contrast, a region where the lower semiconductor layer is absent is provided between the source overlapping region and the drain overlapping region.

12 Claims, 13 Drawing Sheets

(51) Int. Cl.
*H01L 21/8236* (2006.01)
*H01L 27/088* (2006.01)
*H01L 29/786* (2006.01)
*H01L 27/12* (2006.01)
*H01L 29/66* (2006.01)

(52) U.S. Cl.
CPC .......... *H01L 27/088* (2013.01); *H01L 27/124* (2013.01); *H01L 27/1225* (2013.01); *H01L 27/1288* (2013.01); *H01L 29/66742* (2013.01); *H01L 29/786* (2013.01); *H01L 29/7869* (2013.01); *G02F 2201/123* (2013.01)

(58) Field of Classification Search
CPC ............ H01L 27/088; H01L 29/66742; H01L 29/7869; H01L 29/786; H01L 29/1033; H01L 21/02488; H01L 21/8236; H01L 29/41733; H01L 29/78669; H01L 21/02483; H01L 2251/303; G02F 1/1368; G02F 1/136286; G02F 1/134309; G02F 1/133345; G02F 1/13439; G02F 1/1343; G02F 1/1362; G02F 1/136277; G02F 1/1676; G02F 1/13; G02F 1/136227; G02F 1/1333; G02F 2201/123; G02F 2001/13613; G09G 2300/0426; G09G 3/3225
See application file for complete search history.

(56) References Cited

U.S. PATENT DOCUMENTS

| | | |
|---|---|---|
| 2010/0167464 A1 | 7/2010 | Yamazaki |
| 2011/0084266 A1 | 4/2011 | Yamazaki et al. |
| 2011/0136302 A1 | 6/2011 | Yamazaki et al. |
| 2012/0193620 A1 | 8/2012 | Godo et al. |
| 2013/0285047 A1 | 10/2013 | Yamazaki et al. |
| 2015/0069388 A1 | 3/2015 | Kawachi |
| 2015/0364503 A1 | 12/2015 | Tsumura et al. |
| 2017/0330975 A1* | 11/2017 | Ochi .................. C23C 14/08 |

FOREIGN PATENT DOCUMENTS

| | | |
|---|---|---|
| JP | 2012-212941 A | 11/2012 |
| JP | 2012-256838 A | 12/2012 |
| JP | 2013-235277 A | 11/2013 |
| JP | 2013-243343 A | 12/2013 |
| JP | 2013-254121 A | 12/2013 |
| JP | 2015-204368 A | 11/2015 |
| JP | 2015-222827 A | 12/2015 |
| JP | 2016-1673 A | 1/2016 |
| JP | 2017-5039 A | 1/2017 |

OTHER PUBLICATIONS

Notification of Reasons for Refusal dated Jun. 30, 2017 in JP 2017-525423 (with English Translation).

Hsieh, T-Y. et al., "Characterization and Investigation of a Hot-Carrier Effect in a Via-Contact Type a-InGaZnO Thin-Film Transistors," IEEE Transactions on Electron Devices, vol. 60, No. 5, May 2013, pp. 1681-1688.

Nomura, K. et al., "Highly stable amorphous I—Ga—Zn—O thin-film transistors produced by eliminating deep subgap defects," Applies Physics Letters, vol. 99, 2011, 4 pages.

Jeong, J. et al., "Debye Length and Active Layer Thickness-Dependent Performance Variations of Amorphous Oxide-Based TFTs," IEEE Transactions on Electron Devices, vol. 59, No. 3, Mar. 2012, pp. 710-714.

Ha, S.H. et al., "Channel Length Dependent Bias-Stability of Self-Aligned Coplanar a-IGZO TFTs," Journal of Display Technology, vol. 9, No. 12, Dec. 2013, pp. 985-988.

* cited by examiner

THIN-FILM TRANSISTOR, THIN-FILM TRANSISTOR SUBSTRATE, AND LIQUID CRYSTAL DISPLAY DEVICE

TECHNICAL FIELD

The present invention relates to a thin film transistor, a thin film transistor substrate, a liquid crystal display device, and a manufacturing method of a thin film transistor.

BACKGROUND ART

As one flat panel, a liquid crystal display device (liquid crystal display, hereinafter also referred to as an LCD in some cases) has been known. A liquid crystal display device is widely used in a monitor of a personal computer and a portable information terminal device etc., making use of its advantages such as low power consumption, small size, and light weight. In recent years, a liquid crystal display device is also widely used in application to a television.

As a liquid crystal controlling method of LCDs, a twisted nematic (TN) mode has been known. Further, a horizontal electric field mode as typified by an in-plane switching mode and a fringe field switching (FFS) mode has been known. According to a horizontal electric field mode, a wide viewing angle and high contrast can be obtained.

An in-plane switching mode is a display mode in which display is implemented by applying a horizontal electric field to liquid crystals provided between opposing substrates. In an in-plane switching, a pixel electrode and a common electrode to which a horizontal electric field is applied are provided in the same layer. For this reason, liquid crystal molecules located right above a pixel electrode cannot fully be driven, resulting in reducing transmittance.

On the other hand, in an FFS mode, a common electrode and a pixel electrode are arranged with intermediation of an interlayer insulating film, and an oblique electric field (fringe electric field) is thereby generated. For this reason, a horizontal electric field can also be applied to liquid crystal molecules located right above a pixel electrode, and thus liquid crystal molecules located right above a pixel electrode can be fully driven. Therefore, transmittance higher than that of an in-plane switching mode, as well as a wide viewing angle, can be obtained.

In an FFS mode, a fringe electric field is generated between a slit electrode for liquid crystal control provided on an upper layer and a pixel electrode provided on a lower layer of the slit electrode for liquid crystal control with intermediation of the interlayer insulating film. The pixel electrode and the slit electrode for liquid crystal control are formed of a transparent conductive film in this structure, and thus a pixel aperture ratio can be prevented from being reduced. A transparent conductive film is formed of an oxide-based material such as indium tin oxide (ITO) containing indium oxide and tin oxide and InZnO containing indium oxide and zinc oxide.

Further, in an FFS mode, a pixel electrode and a slit electrode for liquid crystal control form a storage capacitor. For this reason, unlike a TN mode, a pattern for a storage capacitor need not necessarily be formed separately in a pixel. This also contributes to a high pixel aperture ratio.

As a switching device of an LCD, a thin film transistor (hereinafter also referred to as a TFT in some cases) has been used. Note that, out of two substrates opposed with intermediation of a liquid crystal layer, a substrate mounted with a TFT is referred to as a TFT substrate. Hitherto, amorphous silicon (a-Si) has been used in a channel layer of a TFT. One reason therefor is that, owing to being amorphous, a film with satisfactory uniformity of characteristics can be formed even on a substrate having a large area. Further, another reason is that, since deposition can be carried out at a comparatively low temperature, an inexpensive glass substrate inferior in heat resistance can be used. Being able to use an inexpensive glass substrate leads to cost reduction, which is desirable in liquid crystal display devices for a general television, in particular.

In recent years, however, a TFT using an oxide semiconductor in its channel layer has been actively developed. An oxide semiconductor has an advantage in that a film of a satisfactorily uniform amorphous state can be stably obtained by optimizing its composition. Further, an oxide semiconductor also has an advantage in that a small-size and high-performance TFT can be realized as the oxide semiconductor has mobility higher than that of a-Si. Accordingly, application of an oxide semiconductor film to a pixel TFT (i.e., a TFT for a pixel) of an FFS mode can realize a TFT substrate having an even higher pixel aperture ratio.

Hitherto, a drive circuit that applies a drive voltage to a pixel TFT is provided in a circuit substrate separate from a TFT substrate, and is externally attached to the TFT substrate. Such a structure is concerned with the demand of a narrower frame in liquid crystal display devices. Specifically, in a case where a TFT of a drive circuit is provided in a frame region (i.e., a peripheral region of a display region) of a TFT substrate and the TFT is formed of a-Si, a comparatively large circuit area for the drive circuit is required in the frame region because mobility of a-Si is low. This leads to increase of a frame region, being unable to satisfy the demand of a narrower frame. For this reason, a drive circuit has been externally attached to a TFT substrate.

However, if a TFT of a drive circuit is formed of an oxide semiconductor having higher mobility, a comparatively small circuit area suffices. For this reason, even when a drive circuit is provided in a frame region of a TFT substrate, the demand of a narrower frame can be satisfied. Further, a drive circuit no longer needs to be externally attached, and thus an LCD can be manufactured at a low cost.

An example of using an oxide semiconductor in a TFT is disclosed in Patent Document 1. According to the disclosure, a second gate insulating film is formed on a first gate insulating film, an oxide semiconductor film is formed on the first and second gate insulating films, and a source electrode and a drain electrode are formed on the oxide semiconductor film. A portion between the source electrode and the drain electrode serves as a channel. The second gate insulating film is formed below a channel in the vicinity of the drain electrode. According to this structure, electrostatic capacity of a channel on the second insulating film is smaller than electrostatic capacity of a channel on the first gate insulating film. With this, the channel in the vicinity of the drain electrode has high resistance, and a TFT having a high withstand voltage can be manufactured.

PRIOR ART DOCUMENTS

Patent Document

Patent Document 1: Japanese Patent Application Laid-Open No. 2012-256838

Non-Patent Documents

Non-Patent Document 1: Tien-Yu Hsieh et al., "Characterization and Investigation of a Hot-Carrier Effect in Via- Contact Type a-InGaZnO Thin-Film Transistors," IEEE TRANSACTIONS ON ELECTRON DEVICES, VOL. 60, NO. 5, MAY 2013, pp. 1681-1688

Non-Patent Document 2: Kenji Nomura et al., "Highly stable amorphous In—Ga—Zn—O thin-film transistors produced by eliminating deep subgap defects," APPLIED PHYSICS LETTERS 99, (2011), 053505

Non-Patent Document 3: Jaewook Jeong and Yongtaek Hong, "Debye Length and Active Layer Thickness-Dependent Performance Variations of Amorphous Oxide-Based TFTs," IEEE TRANSACTIONS ON ELECTRON DEVICES, VOL. 59, NO. 3, MARCH 2012, pp. 710-714

Non-Patent Document 4: Su Hwa Ha et al., "Channel Length Dependent Bias-Stability of Self-Aligned Coplanar a-IGZO TFTs," JOURNAL OF DISPLAY TECHNOLOGY, VOL. 9, NO. 12, DECEMBER 2013, pp. 985-988

SUMMARY

Problem to be Solved by the Invention

In the technology disclosed in Patent Document 1, when defects formed in a surface of an oxide semiconductor is irradiated with light (such as light from a backlight device), holes are excited. Excited holes are attracted by a gate electric field, and are trapped in an interface between the oxide semiconductor and the gate insulating film. Further, excited holes may reach the inside of the gate insulating film to be trapped inside the gate insulating film. Holes trapped in an interface between an oxide semiconductor and a gate insulating film and holes trapped inside a gate insulating film may cause a threshold voltage of a TFT to shift to the negative side.

When a threshold voltage of a TFT shifts to the negative side, characteristics of a TFT according to the designing cannot be obtained, which results in degradation of reliability. Further, when characteristics of each pixel TFT is uneven, display inhomogeneity occurs.

The present invention has been made in order to solve the above-mentioned problems, and has an object to provide a technology of enhancing reliability of a TFT in which a channel region is formed elan oxide semiconductor.

Means to Solve the Problem

A thin film transistor according to one aspect of the present invention includes a gate electrode, a gate insulating film that covers the gate electrode, an oxide semiconductor layer opposed to the gate electrode with intermediation of the gate insulating film, a lower semiconductor layer partially provided between the oxide semiconductor layer and the gate insulating film, and a source electrode and a drain electrode that are brought into contact with the oxide semiconductor layer. The lower semiconductor layer is present in at least one of a source overlapping region where the oxide semiconductor layer overlaps the source electrode and a drain overlapping region where the oxide semiconductor layer overlaps the drain electrode. A region where the lower semiconductor layer is absent is provided between the source overlapping region and the drain overlapping region.

Effects of the Invention

According to the above-mentioned one aspect, in a case where the lower semiconductor layer is present in the source overlapping region, a semiconductor layer present between the source electrode and the gate insulating film is thickened.

For this reason, even in a case a surface of the oxide semiconductor layer is irradiated with light in the vicinity of the source electrode, photoexcited holes can be prevented from reaching the gate insulating film. As a result, a threshold voltage is stabilized even under light irradiation, and high reliability is obtained.

The object, features, aspects, and advantages of the present invention become more obvious with the following detailed description and the attached drawings.

DESCRIPTION OF EMBODIMENTS

First Embodiment

<Configuration of Liquid Crystal Display Device>

Figure 1:
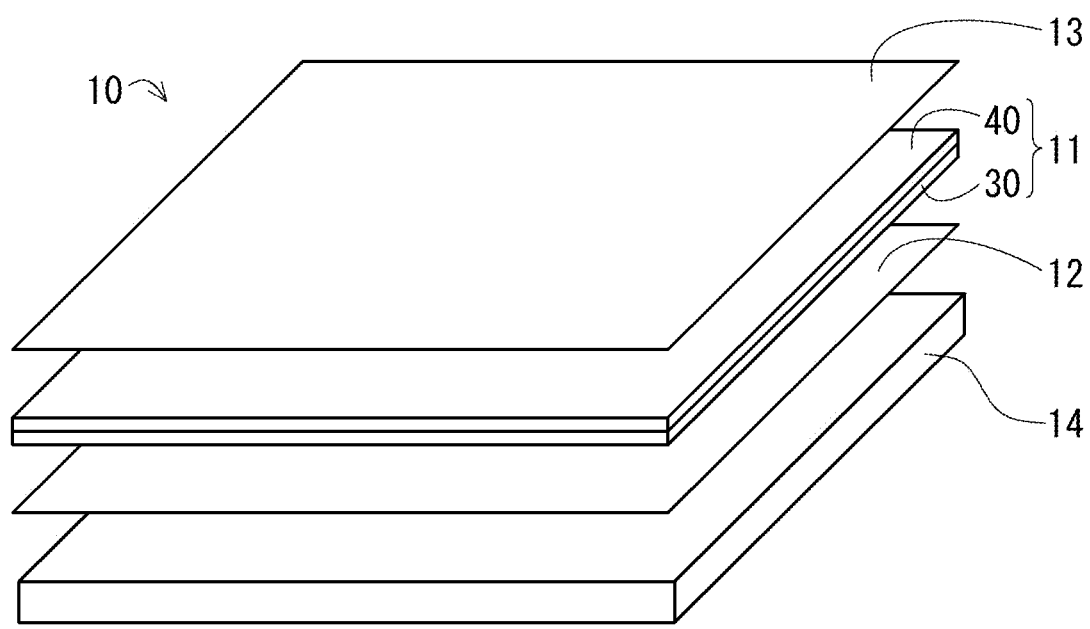
FIG. 1 is an exploded perspective view for illustrating the outline of a configuration of a liquid crystal display device according to a first embodiment.

FIG. 1 is an exploded perspective view for illustrating the outline of a configuration of a liquid crystal display device 10 according to a first embodiment. As illustrated in FIG. 1, the liquid crystal display device 10 includes a liquid crystal panel 11, polarizing plates 12 and 13, and a backlight device 14.

A liquid crystal controlling method of the liquid crystal panel 11 may be any of a twisted nematic (TN) mode, an in-plane switching mode, and a fringe field switching (FFS) mode, and may also be another mode.

Figure 2:
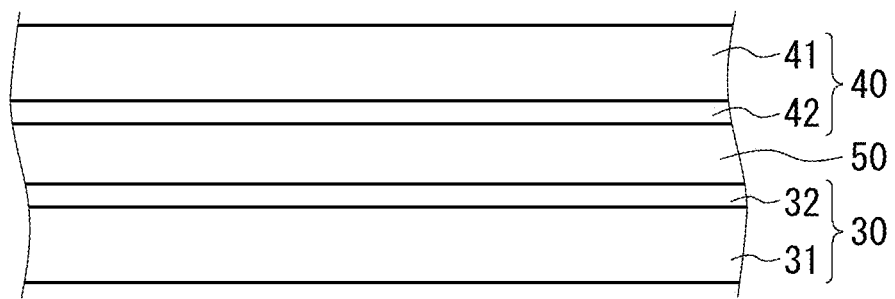
FIG. 2 is a cross-sectional view for illustrating the outline of a configuration of a liquid crystal panel according to the first embodiment.

FIG. 2 is a cross-sectional view for illustrating the outline of a configuration of the liquid crystal panel 11. As illustrated in FIG. 2, the liquid crystal panel 11 includes a TFT substrate (i.e., a thin film transistor substrate) 30, a counter substrate 40 opposed to the TFT substrate 30, and a liquid crystal layer 50 provided between the TFT substrate 30 and the counter substrate 40.

More specifically, the TFT substrate 30 and the counter substrate 40 are opposed with intermediation of a clearance, and the clearance is retained by spacers (not shown). Further, the TFT substrate 30 and the counter substrate 40 are attached by a sealing material in a peripheral portion not shown in FIG. 2, and a container for receiving liquid crystals is formed by the TFT substrate 30, the counter substrate 40, and the sealing material. That is, liquid crystals filled in such a container form the liquid crystal layer 50.

The TFT substrate 30 includes, as illustrated in FIG. 2, a substrate 31 and a TFT-side structure 32. The substrate 31 is formed of a transparent and insulating material such as glass. The TFT-side structure 32 is provided on an inner main surface among main surfaces of the substrate 31 (i.e., a main surface facing the liquid crystal layer 50 and the counter substrate 40). In FIG. 2, illustration of a specific configuration of the TFT-side structure 32 is omitted, and the TFT-side structure 32 is conceptually illustrated.

As in a later specific example, the TFT-side structure 32 includes a circuit element for driving each pixel. The circuit element includes, for example, a pixel TFT (i.e., a pixel transistor), a pixel electrode, a gate wire, a source wire, a scan signal drive circuit, and a display signal drive circuit. In a case where the liquid crystal panel 11 is an in-plane switching mode or an FFS mode, the circuit element includes a common electrode. Further, the TFT-side structure 32 includes, on its topmost layer in contact with the liquid crystal layer 50, an alignment film for aligning liquid crystal molecules. The alignment film is formed of polyimide, for example.

The counter substrate 40 includes, as illustrated in FIG. 2, a substrate 41 and a counter-side structure 42. The substrate 41 is formed of a transparent and insulating material such as glass. The counter-side structure 42 is provided on an inner main surface among main surfaces of the substrate 41 (i.e., a main surface facing the liquid crystal layer 50 and the TFT substrate 30). In FIG. 2, illustration of a specific configuration of the counter-side structure 42 is omitted, and the counter-side structure 42 is conceptually illustrated.

In a case where the liquid crystal panel 11 is a color display type, the counter-side structure 42 includes a color filter for coloring light of each pixel to be a predetermined color. Further, in a case where the liquid crystal panel 11 is a TN mode, the counter-side structure 42 includes a common electrode. Further, similarly to the TFT-side structure 32, the counter-side structure 42 includes an alignment film on its topmost layer in contact with the liquid crystal layer 50.

Referring back to FIG. 1, one polarizing plate 12 is arranged on an outer main surface of the TFT substrate 30, and the other polarizing plate 13 is arranged on an outer main surface of the counter substrate 40. The two polarizing plates 12 and 13 are arranged so that polarizing directions thereof orthogonally cross each other. Note that, the outer main surface of the TFT substrate 30 is an outer main surface of the substrate 31 (i.e., a main surface on the opposite side to the liquid crystal layer 50 and the counter substrate 40). Similarly, the outer main surface of the counter substrate 40 is an outer main surface of the substrate 41 (i.e., a main surface on the opposite side to the liquid crystal layer 50 and the TFT substrate 30).

The backlight device 14 is opposed to the liquid crystal panel 11 with intermediation of the polarizing plate 12, and irradiates the liquid crystal panel 11 with back light via the polarizing plate 12.

<Configuration of TFT Substrate>

Figure 3:
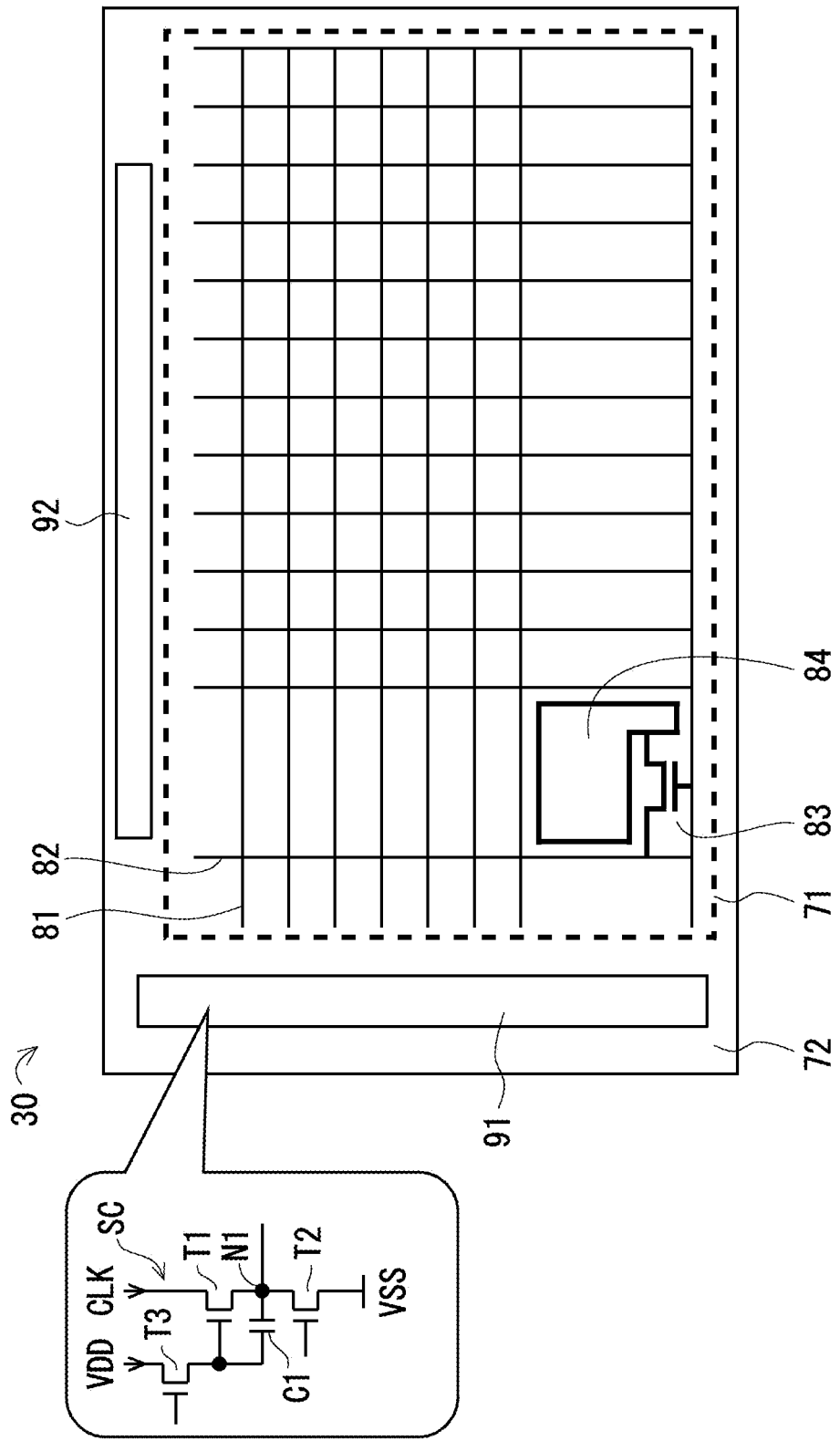
FIG. 3 is a plan view for illustrating the outline of a configuration of a TFT substrate according to the first embodiment.

FIG. 3 is a plan view for illustrating the outline of a configuration of the TFT substrate 30. Here, the liquid crystal panel 11 can roughly be divided into a display region 71 where a plurality of pixels are aligned in a matrix pattern, and a frame region 72 surrounding the display region 71. As illustrated in FIG. 3, the display region 71 and the frame region 72 are defined in the TFT substrate 30 as well.

In the display region 71 of the TFT substrate 30, a plurality of gate wires 81 and a plurality of source wires 82 are arranged so as to orthogonally cross each other. More specifically, each of the gate wires 81 extends in one direction (lengthwise direction in FIG. 3), and the plurality of gate wires 81 are aligned in a direction orthogonal to the extending direction (widthwise direction in FIG. 3) with intervals. On the other hand, each of the source wires 82 extends in a direction orthogonal to the extending direction of the gate wires 81 (widthwise direction in FIG. 3), and the plurality of source wires 82 are aligned in a direction orthogonal to the extending direction (lengthwise direction in FIG. 3) with intervals. Note that, the gate wire 81 and the source wire 82 intersect in a plan view of the TFT substrate 30, but an insulating film is present between the gate wire 81 and the source wire 82.

A pixel (i.e., a pixel region) is provided correspondingly to each intersection between the gate wire 81 and the source wire 82. In FIG. 3, in order to avoid complication of the drawing, a pixel is conceptually illustrated by means of only one pixel, using a pixel TFT 83 and a pixel electrode 84.

In the frame region 72, a scan signal drive circuit 91 for applying a drive voltage to the gate wires 81 and a display signal drive circuit 92 for applying a drive voltage to the source wires 82 are arranged. The scan signal drive circuit 91 successively selects the gate wires 81, and applies a gate-on voltage to the selected gate wire 81. With this, the pixel TFTs 83 connected to the selected gate wire 81 are simultaneously brought into an on state. The display signal drive circuit 92 simultaneously applies a current to each pixel TFT 83 in an on state via the source wire 82. With this, electric charge is stored in each pixel electrode 84 via the pixel TFT 83. The display signal drive circuit 92 controls a current (i.e., electric charge) to be supplied to the pixel electrode 84 in accordance with a gradation level of each pixel.

The scan signal drive circuit 91 includes, as in the added illustration in FIG. 3, a plurality of drive voltage generation circuits SC having drive TFTs (NMOS transistors T1 to T3, herein). Note that, a current flowing in the drive TFT is assumed to flow from a drain electrode to a source electrode.

In the drive voltage generation circuit SC illustrated in FIG. 3, a clock signal CLK is applied to a drain of the NMOS transistor T1. A source of the NMOS transistor TI is connected to a drain of the NMOS transistor T2, and a ground potential VSS is applied to a source of the NMOS transistor T2. A connection node N1 between the NMOS transistors T1 and T2 is connected to a gate of the NMOS transistor T1 and a source of the NMOS transistor T3 via a capacitor C1. A power source potential VDD is applied to a drain of the NMOS transistor T3. The above-mentioned connection node N1 between the NMOS transistors T1 and T2 is an output node of the drive voltage generation circuit SC, and applies a drive voltage to a corresponding gate wire 81.

When the NMOS transistor T3 is turned on by a signal applied to a gate of the NMOS transistor T3, the NMOS transistor T1 is brought into an on state and the clock signal CLK is output from the connection node N1. On the other hand, when the NMOS transistor T2 is turned on by a signal applied to a gate of the NMOS transistor T2, a potential of the connection node N1 is fixed to the ground potential VSS.

The display signal drive circuit 92 also includes a plurality of drive voltage generation circuits SC, and the above-mentioned connection node N1 between the NMOS transistors T1 and T2 applies a drive voltage to a corresponding source wire 82.

<Configuration of TFT>

Figure 4:
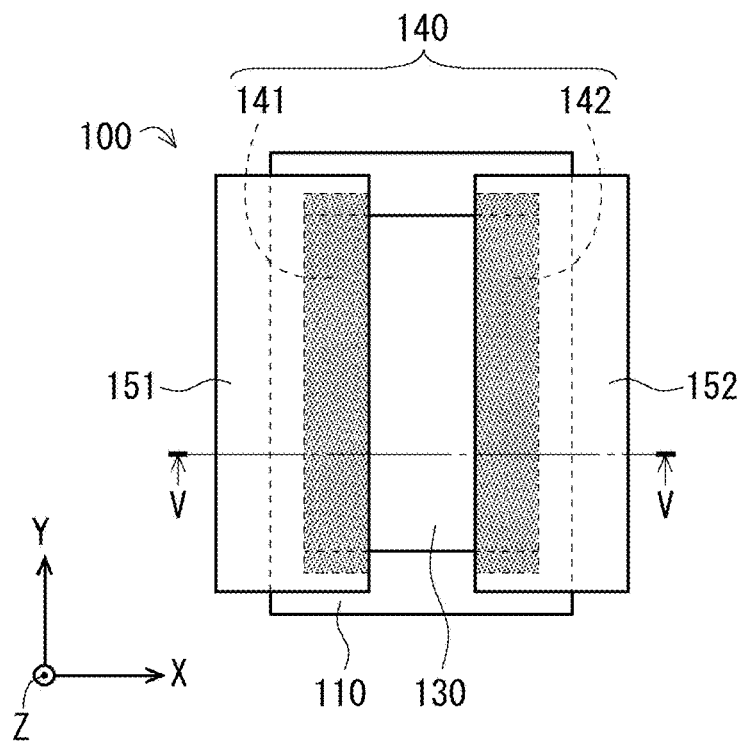
FIG. 4 is a plan view for illustrating a configuration of a TFT according to the first embodiment.
Figure 5:
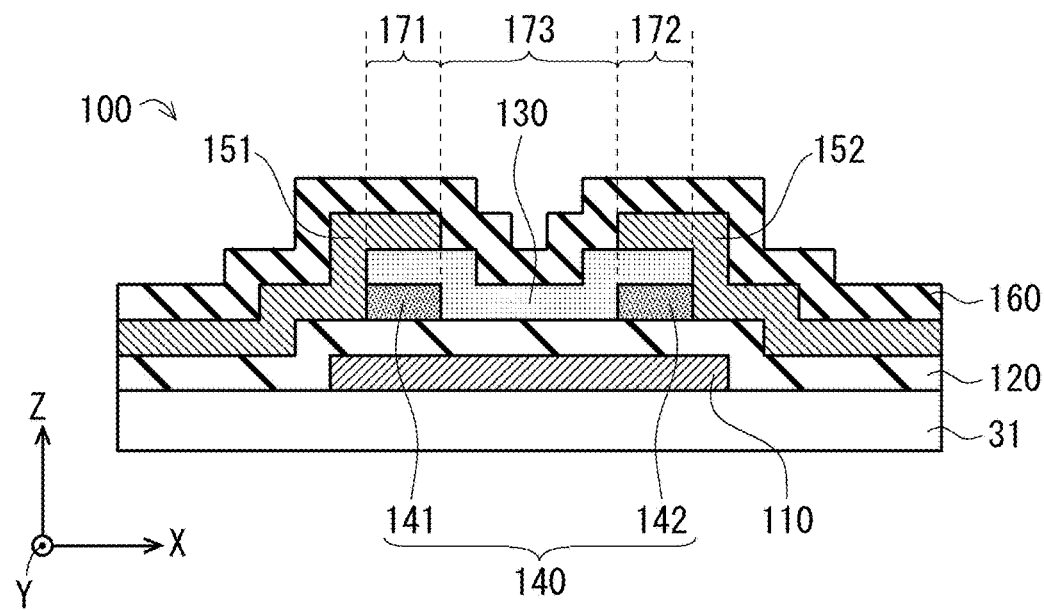
FIG. 5 is a cross-sectional view taken along the line V-V in FIG. 4.

FIG. 4 is a plan view for illustrating a configuration of a TFT 100 according to the first embodiment, and FIG. 5 is a cross-sectional view taken along the line V-V in FIG. 4. Note that, an XYZ orthogonal coordinate system is also illustrated in each of FIG. 4 and FIG. 5. Further, in FIG. 4, for the sake of better understanding of the plan view, a part of components is hatched.

In the following, description is given of an example where the TFT 100 is the pixel TFT 83 (refer to FIG. 3). However, together with the pixel TFT 83 or in place of the pixel TFT 83, the TFT of the drive circuit (e.g., the transistors T1 to T3 of the drive voltage generation circuit SC) may be formed of the TFT 100.

As illustrated in FIG. 5, the TFT 100 is arranged on one main surface (the above-mentioned inner main surface) of the substrate 31 of the TFT substrate 30. Note that, the TFT 100 is included in the above-mentioned TFT-side structure 32 (refer to FIG. 2).

The substrate 31 is, as in the above, formed of a transparent and insulating material such as glass. On the one main surface of the substrate 31, a gate electrode 110 is arranged. The thickness of the gate electrode 110 is, for example, 100 nm. A material of the gate electrode 110 is, for example, an aluminum (Al)-based alloy, more specifically, an alloy obtained by adding 3 mol % of Ni to Al (Al-3 mol % Ni). Note that, "Al-3 mol % Ni" signifies a material obtained by alloying Al with Ni by 3% mole fraction. Note that, the gate electrode 110 may be formed of another metal, or of a conductive material other than metal.

Although illustration is omitted in FIG. 4 and FIG. 5, the gate wire 81 (refer to FIG. 3) is also formed on the substrate 31 along with the gate electrode 110, and the gate electrode 110 is electrically connected to the gate wire 81.

A gate insulating film 120 is arranged so as to cover the gate electrode 110 from a side opposite to the substrate 31. In FIG. 5, the gate insulating film 120 extends not only on the gate electrode 110, but also on the above-mentioned one main surface of the substrate 31. The gate insulating film 120 is, for example, a silicon oxide film (SiO film) having the thickness of 50 to 500 nm.

An oxide semiconductor layer 130 and a lower semiconductor layer 140 are arranged so as to be opposed to the gate electrode 110 with intermediation of the gate insulating film 120. More specifically, the lower semiconductor layer 140 includes a source-side portion 141 and a drain-side portion 142, and the source-side portion 141 and the drain-side portion 142 are arranged on the gate insulating film 120 with a gap therebetween. The oxide semiconductor layer 130 is arranged on the gate insulating film 120 between the source-side portion 141 and drain-side portion 142, and mounts on the source-side portion 141 and the drain-side portion 142. In other words, the source-side portion 141 and drain-side portion 142 of the lower semiconductor layer 140 are partially provided between the oxide semiconductor layer 130 and the gate insulating film 120.

A material of the oxide semiconductor layer 130 is, for example, an InGaZnO-based oxide semiconductor obtained by adding gallium oxide ($Ga_2O_3$) and zinc oxide (ZnO) to indium oxide ($In_2O_3$). An InGaZnO film that forms the oxide semiconductor layer 130 may have an amorphous structure.

A material of the lower semiconductor layer 140 is formed of, for example, an InGaZnO-based oxide semiconductor. An InGaZnO film that forms the lower semiconductor layer 140 may have an amorphous structure. It is desirable that carrier density of the lower semiconductor layer 140 be higher than carrier density of the oxide semiconductor layer 130.

Here, the lower semiconductor layer 140 and the oxide semiconductor layer 130 are assumed to be formed of the same oxide semiconductor. However, the tower semiconductor layer 140 may be formed of a different oxide semiconductor from that of the oxide semiconductor layer 130.

Note that, concerning two oxide semiconductors (e.g., the above-mentioned InGaZnO), the two oxide semiconductors having different composition ratios of constituent atoms are regarded to be different oxide semiconductors even if the constituent atoms are the same. Further, two oxide semiconductors having different carrier densities are regarded to be different oxide semiconductors even if constituent atoms thereof are the same and composition ratios of the constituent atoms are also the same. Further, an oxide semiconductor of an amorphous structure is regarded to be different from an oxide semiconductor of a crystalline structure even if constituent atoms thereof are the same, composition ratios of the constituent atoms are the same, and carrier densities thereof are the same. As a matter of course, oxide semiconductors having different constituent atoms are different oxide semiconductors.

Alternatively, the lower semiconductor layer 140 may be formed of a semiconductor other than an oxide semiconductor, such as silicon, germanium, and a nitride semiconductor. As the nitride semiconductor, for example, gallium nitride (GaN) and aluminum nitride (AlN) are conceivable. In a case where silicon is used in the lower semiconductor layer 140, it is desirable that electron carrier density of silicon be raised to be higher than that of the oxide semiconductor layer 130 by adding phosphorus (P) being an element of Group 15 to silicon, for example.

The thickness of each of the oxide semiconductor layer 130 and the lower semiconductor layer 140 is, for example, 40 nm. However, this is not a restrictive example. For example, it is desirable that the sum of the thickness of the oxide semiconductor layer 130 and the thickness of the lower semiconductor layer 140 be larger than the sum (130 nm) of penetration depth (75 nm) of light and a diffusion length (55 nm) of holes.

A source electrode 151 and a drain electrode 152 are arranged so as to come in contact with an upper surface of the oxide semiconductor layer 130 (surface on the opposite side to the substrate 31 with respect to the oxide semiconductor layer 130).

More specifically, the source electrode 151 is arranged on the oxide semiconductor layer 130 so as to be opposed to the source-side portion 141 of the lower semiconductor layer 140 with intermediation of the oxide semiconductor layer 130. Further, the source electrode 151 lands on the gate insulating film 120 from the top of the oxide semiconductor layer 130 on a side opposite to the drain-side portion 142 of the lower semiconductor layer 140, and extends on the gate insulating film 120. Although illustration is omitted in FIG. 4 and FIG. 5, the source electrode 151 is electrically connected to the source wire 82 (refer to FIG. 3).

The drain electrode 152 is arranged on the oxide semiconductor layer 130 so as to be opposed to the drain-side portion 142 of the lower semiconductor layer 140 with intermediation of the oxide semiconductor layer 130. Further, the drain electrode 152 lands on the gate insulating film 120 from the top of the oxide semiconductor layer 130 on a side opposite to the source-side portion 141 of the lower semiconductor layer 140, and extends on the gate insulating film 120. Although illustration is omitted in FIG. 4 and FIG. 5, the drain electrode 152 is electrically connected to the pixel electrode 84 (refer to FIG. 3).

The source electrode 151 and the drain electrode 152 have, for example, a double-layered structure of a molybdenum (Mo) film and an Al-3 mol % Ni film. The thickness of each of the Mo film and the Al-3 mol % Ni film is, for example, 10 to 100 nm. Note that, the source electrode 151 and the drain electrode 152 may be formed of another metal, or of a conductive material other than metal.

A protective film 160 is arranged on the source electrode 151 and the drain electrode 152 so as to cover the source electrode 151 and the drain electrode 152 from a side opposite to the substrate 31. In FIG. 5, the protective film 160 is arranged even on a portion of the oxide semiconductor layer 130 between the source electrode 151 and the drain electrode 152. Although illustration is omitted in FIG. 5, the protective film 160 exceeds the arrangement range of the source electrode 151 and the drain electrode 152, and extends even on the gate insulating film 120. The protective film 160 is, for example, a silicon oxide film having the thickness of 50 to 500 nm.

Here, as illustrated in FIG. 4 and FIG. 5, the source-side portion 141 of the lower semiconductor layer 140 is present in a source overlapping region 171, where the oxide semiconductor layer 130 overlaps the source electrode 151. Further, the drain-side portion 142 of the lower semiconductor layer 140 is present in a drain overlapping region 172, where the oxide semiconductor layer 130 overlaps the drain electrode 152. In contrast, the lower semiconductor layer 140 is absent in a source-drain inner region 173 being a region between the source overlapping region 171 and the drain overlapping region 172.

Note that, the source-side portion 141 or the drain-side portion 142 may be omitted. That is, the lower semiconductor layer 140 is formed including at least one of the source-side portion 141 and the drain-side portion 142.

Further, in a plan view of FIG. 4, the entire lower semiconductor layer 140 (i.e., the entire source-side portion 141 and the entire drain-side portion 142) falls within the arrangement range of the gate electrode 110. However, at least one of the source-side portion 141 and the drain-side portion 142 may come out beyond the arrangement range of the gate electrode 110.

Further, the source-side portion 141 of the lower semiconductor layer 140 may have the same shape as the source electrode 151 in a plan view (refer to FIG. 4), or may come out beyond the arrangement range of the source electrode 151. Similarly, the drain-side portion 142 of the lower semiconductor layer 140 may have the same shape as the drain electrode 152 in a plan view (refer to FIG. 4), or may come out beyond the arrangement range of the drain electrode 152.

Further, in a plan view of FIG. 4, the entire oxide semiconductor layer 130 falls within the arrangement range of the gate electrode 110. However, the oxide semiconductor layer 130 may come out beyond the arrangement range of the gate electrode 110.

Further, as illustrated in FIG. 4, it is desirable that a Y-direction dimension (so-called gate width) of the oxide semiconductor layer 130 be smaller than a Y-direction dimension of the lower semiconductor layer 140.

Further, in FIG. 4 and FIG. 5, the lower semiconductor layer 140 is absent in the source-drain inner region 173 being a region between the source overlapping region 171 and the drain overlapping region 172. However, this is not a restrictive example. That is, the source-side portion 141 of the lower semiconductor layer 140 may come out toward the drain side to enter the source-drain inner region 173. Further, the drain-side portion 142 of the lower semiconductor layer 140 may come out toward the source side to enter the source-drain inner region 173.

<Manufacturing Method of TFT>

Figure 6:
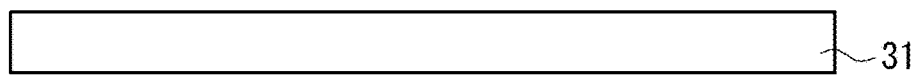
FIG. 6 is a cross-sectional view for illustrating a manufacturing method of the TFT according to the first embodiment

FIG. 6 to FIG. 19 are cross-sectional views for illustrating a manufacturing method of the TFT 100. Firstly, as illustrated in FIG. 6, the substrate 31 formed of a transparent and insulating material such as glass is prepared.

Figure 7:
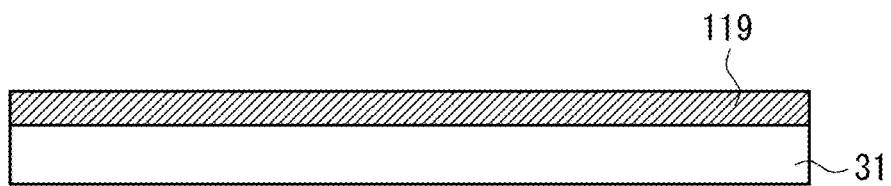
FIG. 7 is a cross-sectional view for illustrating a manufacturing method of the TFT according to the first embodiment.

Then, as illustrated in FIG. 7, a first conductive film 119 being a conductive film for the gate electrode 110 is formed on one entire main surface of the substrate 31. The thickness of the first conductive film 119 is, for example, 100 nm. A material of the first conductive film 119 is, for example, an aluminum (Al)-based alloy, more specifically, an alloy obtained by adding 3 mol % of Ni to Al (Al-3 mol % Ni). The Al-3 mol % Ni film may be formed with a sputtering method using an Al-3 mol % Ni alloy target. As a sputtering gas, an argon (Ar) gas, a krypton (Kr) gas, and the like may be used. Note that, the first conductive film 119 may be formed of another metal, or of a conductive material other than metal.

Figure 8:
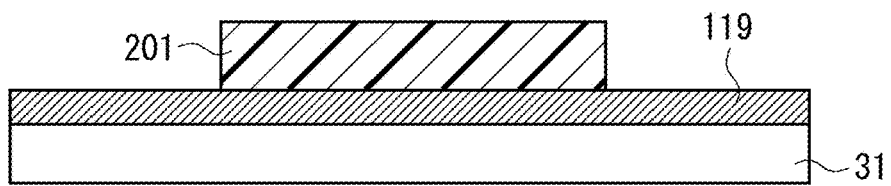
FIG. 8 is a cross-sectional view for illustrating a manufacturing method of the TFT according to the first embodiment.
Figure 9:
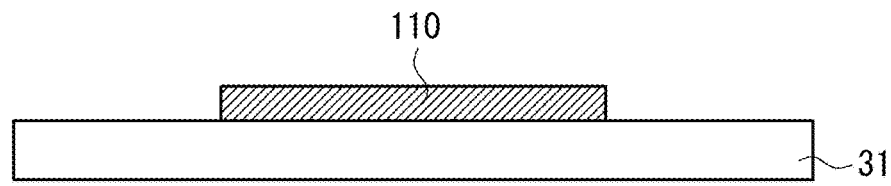
FIG. 9 is a cross-sectional view for illustrating a manufacturing method of the TFT according to the first embodiment.

Next, a photoresist is applied to an entire surface on the first conductive film 119, and the photoresist is patterned with a photolithography technology. With this, as illustrated in FIG. 8, a patterning mask 201 for the gate electrode 110 is formed. As the photoresist, for example, a novolak positive photosensitive resin may be used. The thickness of the photoresist is, for example, approximately 1.5 μm.

Then, wet etching is performed on the substrate 31 reaching a state in which the patterning mask 201 is formed (refer to FIG. 8) using a PAN-based solution containing phosphoric acid, acetic acid, and nitric acid. At this time, the patterning mask 201 functions as an etching mask, and thus the gate electrode 110 is formed of the first conductive film 119. After that, the patterning mask 201 is removed using an amine-based resist stripper liquid (refer to FIG. 9).

Note that, the patterning mask 201 may be formed so as to have not only a pattern for the gate electrode 110, but also a pattern for the gate wire 81 (refer to FIG. 3). With this, the gate electrode 110 and the gate wire 81 can be simultaneously formed of the first conductive film 119.

Figure 10:
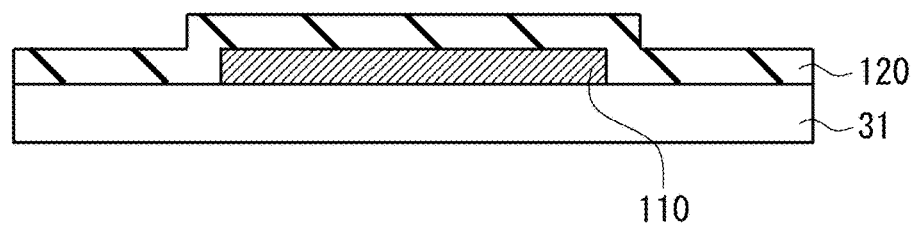
FIG. 10 is a cross-sectional view for illustrating a manufacturing method of the TFT according to the first embodiment.

Next, as illustrated in FIG. 10, the gate insulating film 120 is formed on the substrate 31 so as to cover the gate electrode 110. The gate insulating film 120 is, for example, a silicon oxide film having the thickness of 50 to 500 nm. The silicon oxide film may be formed with a plasma chemical vapor deposition (CVD) method using a silane ($SiH_4$) gas and a dinitrogen monoxide ($N_2O$) gas, for example.

Figure 11:
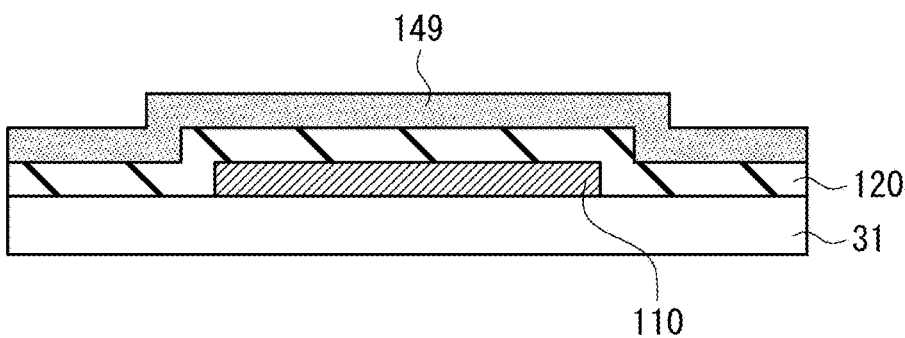
FIG. 11 is a cross-sectional view for illustrating a manufacturing method of the TFT according to the first embodiment.

Next, as illustrated in FIG. 11, a semiconductor film 149 for the lower semiconductor layer 140 is formed on an entire surface on the gate insulating film 120. The thickness of the semiconductor film 149 is, for example, 40 nm. A material of the semiconductor film 149 is, for example, an InGaZnO-based oxide semiconductor obtained by adding gallium oxide ($Ga_2O_3$) and zinc oxide (ZnO) to indium oxide ($In_2O_3$). An InGaZnO film that forms the semiconductor film 149 may have an amorphous structure.

For example, the semiconductor film 149 is formed with a DC sputtering method using an InGaZnO target [$In_2O_3$.($Ga_2O_3$).($ZnO)_2$] having an atomic composition ratio of In:Ga:Zn:O=1:1:1:4. As a sputtering gas, an Ar gas, a Kr gas, and the like may be used. In the InGaZnO film thus formed with such a sputtering method, usually, an atomic composition ratio of oxygen is less than the stoichiometric composition. That is, a film in a condition of oxygen ion deficiency (condition in which a composition ratio of O is less than 4 in the above-mentioned example) is formed. For this reason, it is desirable that sputtering be performed on a condition in which an oxygen ($O_2$) gas is mixed into an Ar gas. Here, sputtering was performed using a mixed gas in which a partial pressure ratio of 10% of an $O_2$ gas is added to an Ar gas.

Note that, as the semiconductor film 149, a semiconductor other than an oxide semiconductor, such as silicon, germanium, and a nitride semiconductor, may be formed using a publicly-known deposition technology. As the nitride semiconductor, for example, gallium nitride (GaN) and aluminum nitride (AlN) are conceivable.

Figure 12:
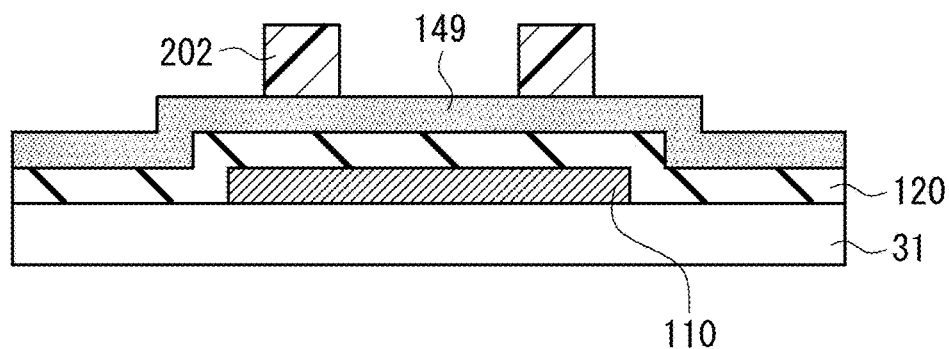
FIG. 12 is a cross-sectional view for illustrating a manufacturing method of the TFT according to the first embodiment.
Figure 13:
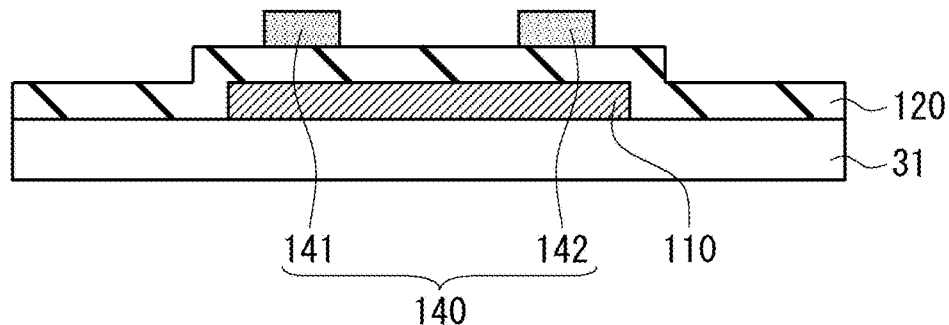
FIG. 13 is a cross-sectional view for illustrating a manufacturing method of the TFT according to the first embodiment.

Next, a photoresist is applied to an entire surface on the semiconductor film 149, and the photoresist is patterned with a photolithography technology. With this, as illustrated in FIG. 12, a patterning mask 202 for the lower semiconductor layer 140 is formed. As the photoresist, for example, a novolak positive photosensitive resin may be used. The thickness of the photoresist is, for example, approximately 1.5 μm.

Then, wet etching is performed on the substrate 31 reaching a state in which the patterning mask 202 is formed (refer to FIG. 12) using a solution containing nitric acid or oxalic acid. At this time, the patterning mask 202 functions as an etching mask, and thus the lower semiconductor layer 140 is formed of the semiconductor film 149. After that, the patterning mask 202 is removed using an amine-based resist stripper liquid (refer to FIG. 13).

Figure 14:
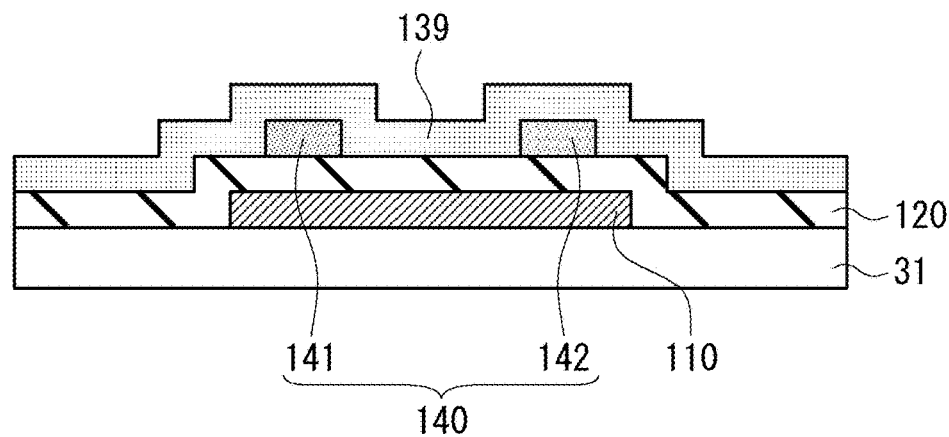
FIG. 14 is a cross-sectional view for illustrating a manufacturing method of the TFT according to the first embodiment.

Next, as illustrated in FIG. 14, an oxide semiconductor film 139 for the oxide semiconductor layer 130 is formed on an entire surface on the gate insulating film 120 so as to cover the lower semiconductor layer 140. The thickness of the oxide semiconductor film 139 is, for example, 40 nm. A material of the oxide semiconductor film 139 is, for example, an InGaZnO-based oxide semiconductor obtained by adding gallium oxide ($Ga_2O_3$) and zinc oxide (ZnO) to indium oxide ($In_2O_3$). An InGaZnO film that forms the oxide semiconductor film 139 may have an amorphous structure.

For example, the oxide semiconductor film 139 is formed with a DC sputtering method using an InGaZnO target [$In_2O_3$.($Ga_2O_3$).($ZnO)_2$] having an atomic composition ratio of In:Ga:Zn:O=1:1:1:4. As a sputtering gas, an Ar gas, a Kr gas, and the like may be used. As in the above, it is desirable that sputtering be performed on a condition in which an $O_2$ gas is mixed into an Ar gas. Here, a mixed gas in which a partial pressure ratio of 10% of an $O_2$ gas is added to an Ar gas was used.

Here, the semiconductor film 149 and the oxide semiconductor film 139 are assumed to be formed of the same oxide semiconductor. However, different oxide semiconductors may be adopted. For example, it is desirable that carrier density of the semiconductor film 149 be higher than carrier density of the oxide semiconductor film 139. With this, carrier density of the lower semiconductor layer 140 can be raised to be higher than carrier density of the oxide semiconductor layer 130.

Figure 15:
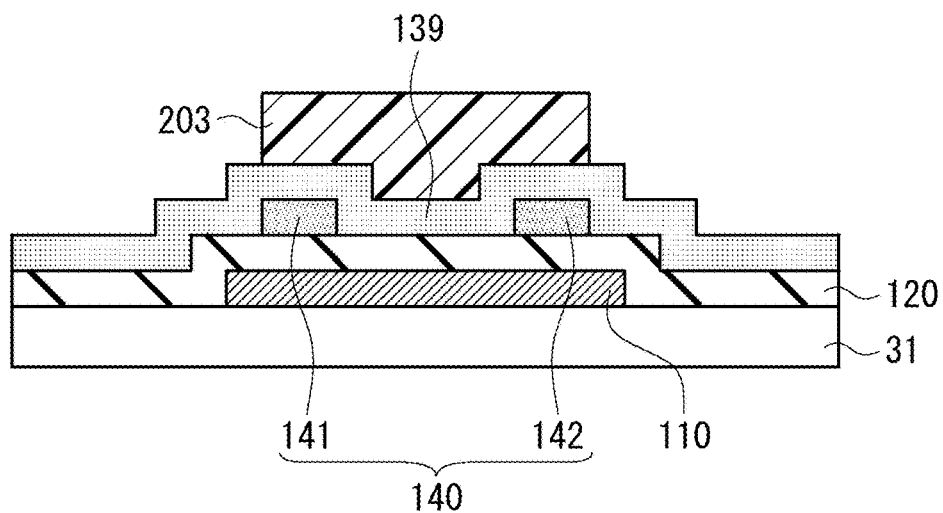
FIG. 15 is a cross-sectional view for illustrating a manufacturing method of the TFT according to the first embodiment.
Figure 16:
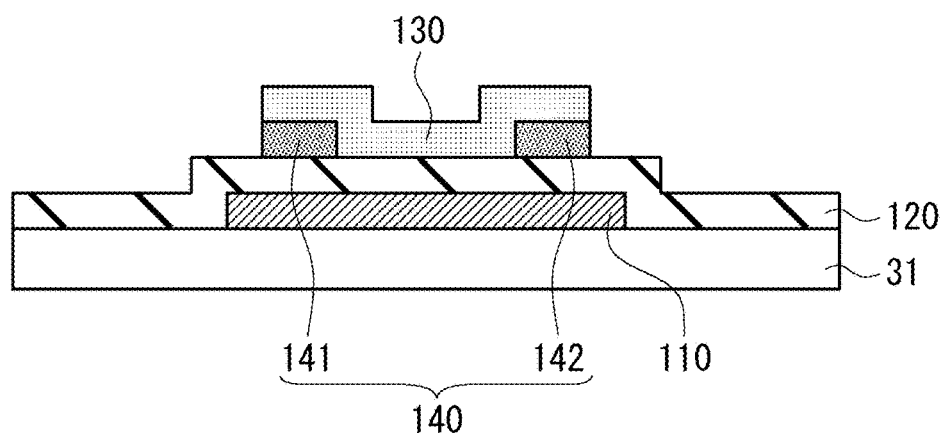
FIG. 16 is a cross-sectional view for illustrating a manufacturing method of the TFT according to the first embodiment.

Next, a photoresist is applied to an entire surface on the oxide semiconductor film 139, and the photoresist is patterned with a photolithography technology. With this, as illustrated in FIG. 15, a patterning mask 203 for the oxide semiconductor layer 130 is formed. As the photoresist, for example, a novolak positive photosensitive resin may be used. The thickness of the photoresist is, for example, approximately 1.5 μm.

Then, wet etching is performed on the substrate 31 reaching a state in which the patterning mask 203 is formed (refer to FIG. 15) using a solution containing nitric acid or oxalic acid. At this time, the patterning mask 203 functions as an etching mask, and thus the oxide semiconductor layer 130 is formed of the oxide semiconductor film 139. After that, the patterning mask 203 is removed using an amine-based resist stripper liquid (refer to FIG. 16).

Figure 17:
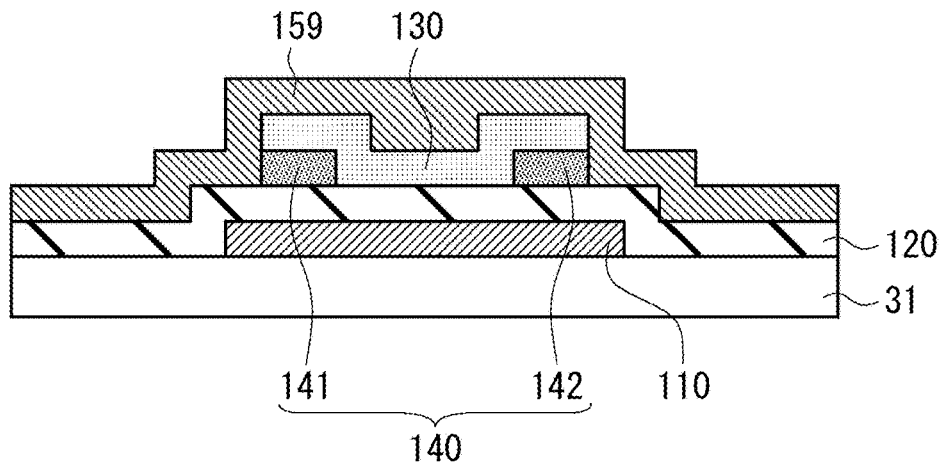
FIG. 17 is a cross-sectional view for illustrating a manufacturing method of the TFT according to the first embodiment.

Next, as illustrated in FIG. 17, a second conductive film 159 for the source electrode 151 and the drain electrode 152 is formed on an entire surface on the gate insulating film 120 so as to cover the oxide semiconductor layer 130. The second conductive film 159 has, for example, a double-layered structure of a Mo film and an Al-3 mol % Ni film. Specifically, a Mo film is formed in the thickness of 10 to 100 nm, for example, with a DC sputtering method using a Mo target, and subsequently, an Al-3 mol % Ni film is formed in the thickness of 10 to 100 nm, for example, with a sputtering method using an Al-3 mol % Ni alloy target.

Note that, the second conductive film 159 may be formed of another metal, or of a conductive material other than metal.

Figure 18:
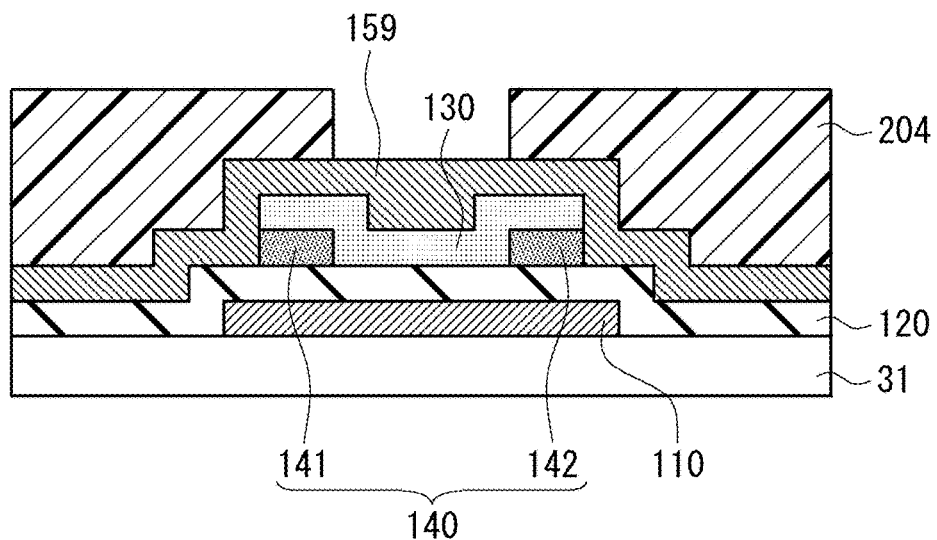
FIG. 18 is a cross-sectional view for illustrating a manufacturing method of the TFT according to the first embodiment.
Figure 19:
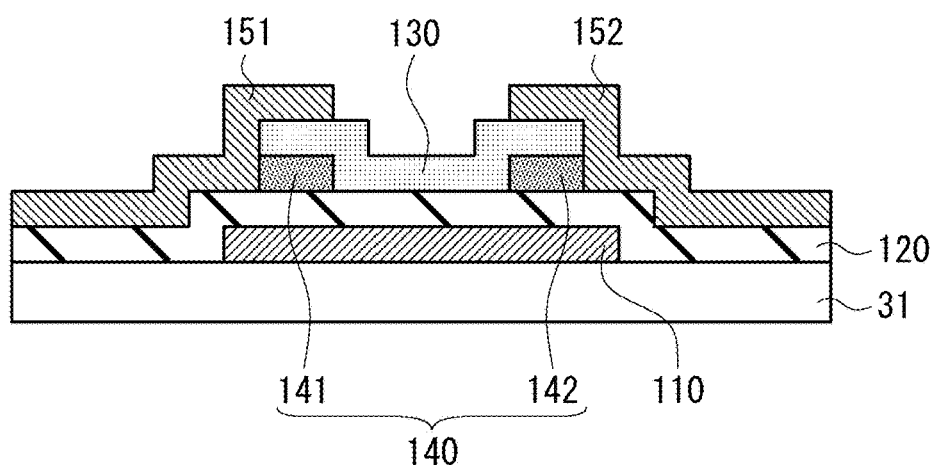
FIG. 19 is a cross-sectional view for illustrating a manufacturing method of the TFT according to the first embodiment.

Next, a photoresist is applied to an entire surface on the second conductive film 159, and the photoresist is patterned with a photolithography technology. With this, as illustrated in FIG. 18, a patterning mask 204 for the source electrode 151 and the drain electrode 152 is formed. As the photoresist, for example, a novolak positive photosensitive resin may be used. The thickness of the photoresist is, for example, approximately 1.5 μm.

Then, wet etching is performed on the substrate 31 reaching a state in which the patterning mask 204 is formed (refer to FIG. 18) using a PAN-based solution. At this time, the patterning mask 204 functions as an etching mask, and thus the source electrode 151 and the drain electrode 152 are formed of the second conductive film 159. After that, the patterning mask 204 is removed using an amine-based resist stripper liquid (refer to FIG. 19).

After that, the protective film 160 is formed so as to cover the source electrode 151, the drain electrode 152, and the oxide semiconductor layer 130 (refer to FIG. 5). The protective film 160 is, for example, a silicon oxide film having the thickness of 50 to 500 nm. The silicon oxide film may be formed with a plasma CVD method using a gas and a $N_2O$ gas, for example.

Through the above process, the TFT 100 having a configuration illustrated in FIG. 5 can be obtained.

Here, as in the above, the source-side portion 141 or the drain-side portion 142 may be omitted in the lower semiconductor layer 140. In view of this respect, the lower semiconductor layer 140 is formed in at least one of a forming region of the source-side portion 141 (including the source overlapping region 171) and a forming region of the drain-side portion 142 (including the drain overlapping region 172). The pattern of the lower semiconductor layer 140 can be controlled with the patterning mask 202.

Note that, as in the above, the shape of the lower semiconductor layer 140 in a plan view is not limited to the example of FIG. 4. That is, the lower semiconductor layer 140 may be formed in various shapes of the above. The same also applies to the shape and the dimension of the oxide semiconductor layer 130 in a plan view.

<Manufacturing Method of Liquid Crystal Display Device>

Using the above-mentioned manufacturing method of the TFT 100, the TFT substrate 30 (refer to FIG. 2 and FIG. 3) can be manufactured. Then, the TFT substrate 30 is attached to the counter substrate 40 (refer to FIG. 2) that is separately manufactured. At this time, spacers are arranged between the TFT substrate 30 and the counter substrate 40 in advance, thereby providing a clearance between the TFT substrate 30 and the counter substrate 40. Liquid crystals are injected into the clearance, and the liquid crystal injection port is then sealed. Note that, liquid crystals may be arranged with a one drop fill method. In this manner, the liquid crystal panel 11 (refer to FIG. 1 and FIG. 2) is manufactured.

After that, the polarizing plates 12 and 13 and the backlight device 14 are arranged with respect to the liquid crystal panel 11 (refer to FIG. 1). With this, the liquid crystal display device 10 is obtained.

<Effects>

As in the above, the TFT 100 includes the gate electrode 110, the gate insulating film 120, the oxide semiconductor layer 130, the lower semiconductor layer 140, the source electrode 151, and the drain electrode 152. More specifically, the gate insulating film 120 covers the gate electrode 110. The oxide semiconductor layer 130 is opposed to the gate electrode 110 with intermediation of the gate insulating film 120. The lower semiconductor layer 140 is partially provided between the oxide semiconductor layer 130 and the gate insulating film 120. The source electrode 151 and the drain electrode 152 come in contact with the oxide semiconductor layer 130.

The lower semiconductor layer 140 is present in at least one of the source overlapping region 171 where the oxide semiconductor layer 130 overlaps the source electrode 151 and the drain overlapping region 172 where the oxide semiconductor layer 130 overlaps the drain electrode 152. In contrast, a region where the lower semiconductor layer 140 is absent is provided between the source overlapping region 171 and the drain overlapping region 172.

Accordingly, in a case where the lower semiconductor layer 140 is present in the source overlapping region 171, a semiconductor layer present between the source electrode 151 and the gate insulating film 120 is thickened. For this reason, even in a case where a surface of the oxide semiconductor layer 130 is irradiated with light (such as light from the backlight device 14) in the vicinity of the source electrode 151, photoexcited holes can be prevented from reaching the gate insulating film 120. With this, holes to be trapped in an interface between the semiconductor layer and the gate insulating film 120 (specifically, an interface between the lower semiconductor layer 140 and the gate insulating film 120) and holes to be trapped inside the gate insulating film 120 can be reduced. Since trapped holes may cause a threshold voltage of a TFT to shift to the negative side, such threshold voltage shift can be thereby prevented. This holds the same for a case where the lower semiconductor layer 140 is present in the drain overlapping region 172. As a result, a threshold voltage is stabilized even under light irradiation, and high reliability is obtained.

Note that, Non-Patent Document 1 provides description of a TFT having a configuration in which a gate electrode formed of Mo, a gate insulating film, a channel layer formed of InGaZnO, a SiO film, and a top gate formed of indium-tin-oxide (ITO) are stacked. Note that, a source electrode and a drain electrode are connected to the channel layer. Particularly, an electric field is applied from the top gate, thereby changing a conduction-band potential of a channel center portion. Specifically, when a negative bias is applied to the top gate, a conduction-band potential of the channel center portion is increased, and a threshold voltage shifts to the positive side. In contrast, even when a positive bias is applied to the top gate, a threshold voltage does not shift to the negative side. This is because a conduction-hand potential of the channel center portion is reduced, whereas a conduction-band potential in the vicinity of the source electrode and the drain electrode being end portions of the channel are not changed. Accordingly, such is conceivable that a threshold voltage can be prevented from shifting to the negative side on condition that the hole trap in the vicinity of the source electrode and the drain electrode is prevented.

Here, the lower semiconductor layer 140 may be formed of silicon, germanium, or a nitride semiconductor, or of an oxide semiconductor the same as or different from that of the oxide semiconductor layer 130. In a case where the lower semiconductor layer 140 is formed of silicon, the lower semiconductor layer 140 can serve to absorb light passing through the gate insulating film 120 to enter the oxide semiconductor layer 130. With this, light can be prevented from entering the oxide semiconductor layer 130, and thus a photoexcited hole itself can be reduced. As a result, a threshold voltage is stabilized even under light irradiation, and high reliability is obtained.

On the other hand, a region where the lower semiconductor layer 140 is absent is provided in the source-drain inner region 173 being a region between the source overlapping region 171 and the drain overlapping region 172. For this reason, thickening of a semiconductor layer in the source-drain inner region 173 can be avoided. As a result, as compared to a configuration in which a semiconductor layer is thick also in the source-drain inner region 173, an off-current can reduced to be low. Also in this respect, high reliability is obtained.

Note that, Non-Patent Document 3 provides description that, when an oxide semiconductor film (specifically, an InGaZnO film) forming a channel layer is thickened, a gate electric field is not applied to a surface of the oxide semiconductor film, and an off-current is increased. Referring to this, the advantage of the presence of a region where the lower semiconductor layer 140 is absent in the source-drain inner region 173 in the TFT 100 can be understood.

Here, as in the above, it is desirable that the sum of the thickness of the oxide semiconductor layer 130 and the thickness of the lower semiconductor layer 140 be larger than the sum of penetration depth of light and a diffusion length of holes. According to such a dimensional relationship, holes photoexcited in the vicinity of the source electrode 151 or the drain electrode 152 can be effectively prevented from reaching the gate insulating film 120.

Note that, Non-Patent Document 2 provides description that, when an oxide semiconductor film (specifically, an InGaZnO film) forming a channel layer is thickened, holes excited due to light irradiation can be prevented from reaching an interface between an oxide semiconductor and a gate insulating film. This effect is more notably observed in a case where the thickness of an oxide semiconductor layer is larger than the sum of penetration depth (75 nm) of light and a diffusion length (55 nm) of holes. Referring to such a content of Non-Patent Document 2, the advantage of the larger sum of the thickness of the oxide semiconductor layer 130 and the thickness of the lower semiconductor layer 140 than the sum of penetration depth of light and a diffusion length of holes in the TFT 100 can be understood.

Further, as in the above, it is desirable that carrier density of the lower semiconductor layer 140 be higher than carrier density of the oxide semiconductor layer 130. According to such a relationship of carrier density, a large number of carriers are stored in the lower semiconductor layer 140 when a positive bias is applied to the gate electrode 110, and an on-current of the TFT 100 can be increased to be high.

Note that, Non-Patent Document 4 suggests that diffusion of carriers from a region of high carrier density to a region of low carrier density in a coplanar structure prevents threshold voltage shift at the time of application of a positive bias. Referring to this, when carriers are diffused form the lower semiconductor layer 140 to the oxide semiconductor layer 130, the TFT 100 can provide high reliability.

As in the above, the liquid crystal display device 10 includes the TFT substrate 30 having the TFT 100, the counter substrate 40 opposed to the TFT substrate 30, and the liquid crystal layer 50 provided between the TFT substrate 30 and the counter substrate 40.

For this reason, the liquid crystal display device 10 can be provided with high reliability. Further, in a case where such a highly reliable TFT 100 is applied to the pixel TFT 83, unevenness in characteristics of each pixel TFT 83 is reduced, and display inhomogeneity can thereby be reduced.

Further, a channel region of the TFT 100 is formed of the oxide semiconductor layer 130. An oxide semiconductor is high in mobility, and therefore the TFT 100 can be downsized. For this reason, in a case where the TFT 100 is applied to the pixel TFT 83, a high-resolution liquid crystal display device 10 can be provided.

Further, in a case where the TFT 100 is applied to a TFT of a drive circuit (e.g., the transistors T1 to T3 of the drive voltage generation circuit SC), the scan signal drive circuit 91 and the display signal drive circuit 92 can be downsized. As a result, the drive circuits 91 and 92 can be arranged in the frame region 72 of the TFT substrate 30 (refer to FIG. 3). Further, as compared to a configuration in which the drive circuits 91 and 92 are externally attached, the cost concerning the drive circuits 91 and 92 can be reduced. Further, according to such downsized drive circuits 91 and 92, the frame region 72 can be prevented from being increased, and thus a narrower frame can be realized.

Incidentally, according to the above-mentioned manufacturing method, a manufacturing method of the TFT 100 includes a process of forming the gate electrode 110, a process of forming the gate insulating film 120, a process of forming the lower semiconductor layer 140, a process of forming the oxide semiconductor layer 130, and a process of forming the source electrode 151 and the drain electrode 152.

In a process of forming the gate electrode 110, the first conductive film 119 is formed on the substrate 31 and then the first conductive film 119 is patterned, thereby forming the gate electrode 110. In a process of forming the gate insulating film 120, the gate insulating film 120 is formed so as to cover the gate electrode 110.

In a process of forming the lower semiconductor layer 140, the semiconductor film 149 is formed on the gate insulating film 120 and then the semiconductor film 149 is patterned, thereby forming the lower semiconductor layer 140 so as to be opposed to the gate electrode 110 with intermediation of the gate insulating film 120. Here, in a process of forming the lower semiconductor layer 140, the lower semiconductor layer 140 is formed in at least one of the source overlapping region 171 where the oxide semiconductor layer 130 overlaps the source electrode 151 (more specifically, to be bound to overlap the source electrode 151 after the formation of the source electrode 151) and the drain overlapping region 172 where the oxide semiconductor layer 130 overlaps the drain electrode 152 (more specifically, to be bound to overlap the drain electrode 152 after the formation of the drain electrode 152). In contrast, the lower semiconductor layer 140 is not formed in at least a part of the source-drain inner region 173 being a region between the source overlapping region 171 and the drain overlapping region 172.

In a process of forming the oxide semiconductor layer 130, the oxide semiconductor film 139 is formed so as to cover the lower semiconductor layer 140 and the gate insulating film 120 and then the oxide semiconductor film 139 is patterned, thereby forming the oxide semiconductor layer 130 so as to extend on the lower semiconductor layer 140 and on the gate insulating film 120.

In a process of forming the source electrode 151 and the drain electrode 152, the second conductive film 159 is formed so as to cover the oxide semiconductor layer 130 and then the second conductive film 159 is patterned, thereby forming the source electrode 151 and the drain electrode 152 so as to come in contact with the oxide semiconductor layer 130.

Accordingly, the TFT 100 can be manufactured with four times of patterning.

Figure 20:
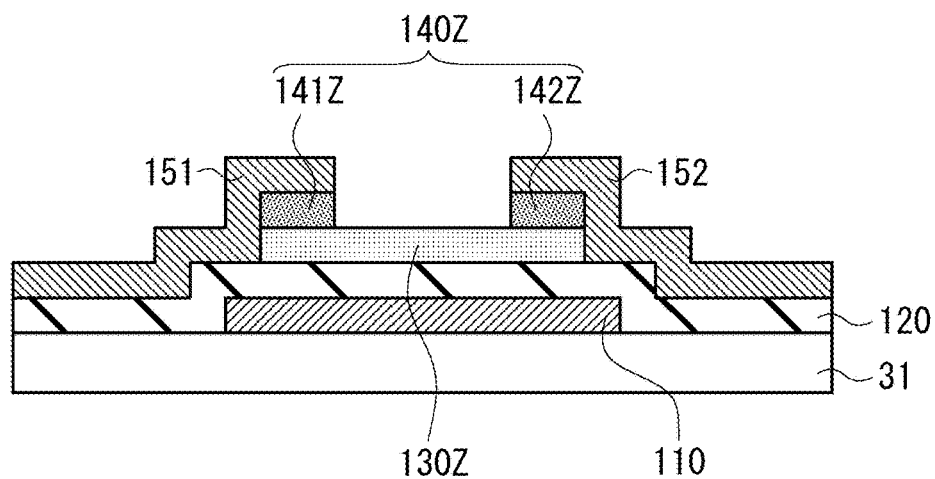
FIG. 20 is a cross-sectional view for illustrating a configuration of a TFT according to a comparative example.

Here, FIG. 20 is a cross-sectional view for illustrating a configuration of a TFT according to a comparative example.

In a configuration of FIG. 20, an oxide semiconductor layer 130Z, a semiconductor layer 140Z, a source-side portion 141Z, and a drain-side portion 142Z correspond to the oxide semiconductor layer 130, the semiconductor layer 140, the source-side portion 141, and the drain-side portion 142 described above, respectively. Note that, the stacking order of the semiconductor layers 130Z and 140Z is different from the stacking order of the above-mentioned semiconductor layers 130 and 140 (e.g., refer to FIG. 5). According to a configuration of FIG. 20 as well, a semiconductor layer present between the source electrode 151 and the gate insulating film 120 can be thickened.

However, the configuration of FIG. 20 has problems as described below.

That is, it is difficult to pattern the source-side portion 141Z and the drain-side portion 142Z of the semiconductor layer 140Z as an upper layer such that the oxide semiconductor layer 130Z as a lower layer is uniformly reserved. Especially in a case where the oxide semiconductor layer 130Z and the semiconductor layer 140Z are intended to be formed of the same oxide semiconductor, accurately finishing etching for forming the source-side portion 141Z and the drain-side portion 142Z at the position of the interface between the semiconductor layers 130Z and 140Z in the entire interface is difficult. For this reason, large limitation is imposed on selection of materials of the oxide semiconductor layer 130Z and the semiconductor layer 140Z.

Further, a process of forming the semiconductor layer 140Z as an upper layer (process such as deposition and etching) damages the oxide semiconductor layer 130Z as a lower layer, that is, a channel region of the TFT. With this, characteristics of the TFT may be deteriorated.

Accordingly, it is preferable that the semiconductor layer 140 be arranged on a lower layer of the oxide semiconductor layer 130 as in the above-mentioned configuration according to the first embodiment.

Second Embodiment

<Configuration of TFT Substrate>

Figure 21:
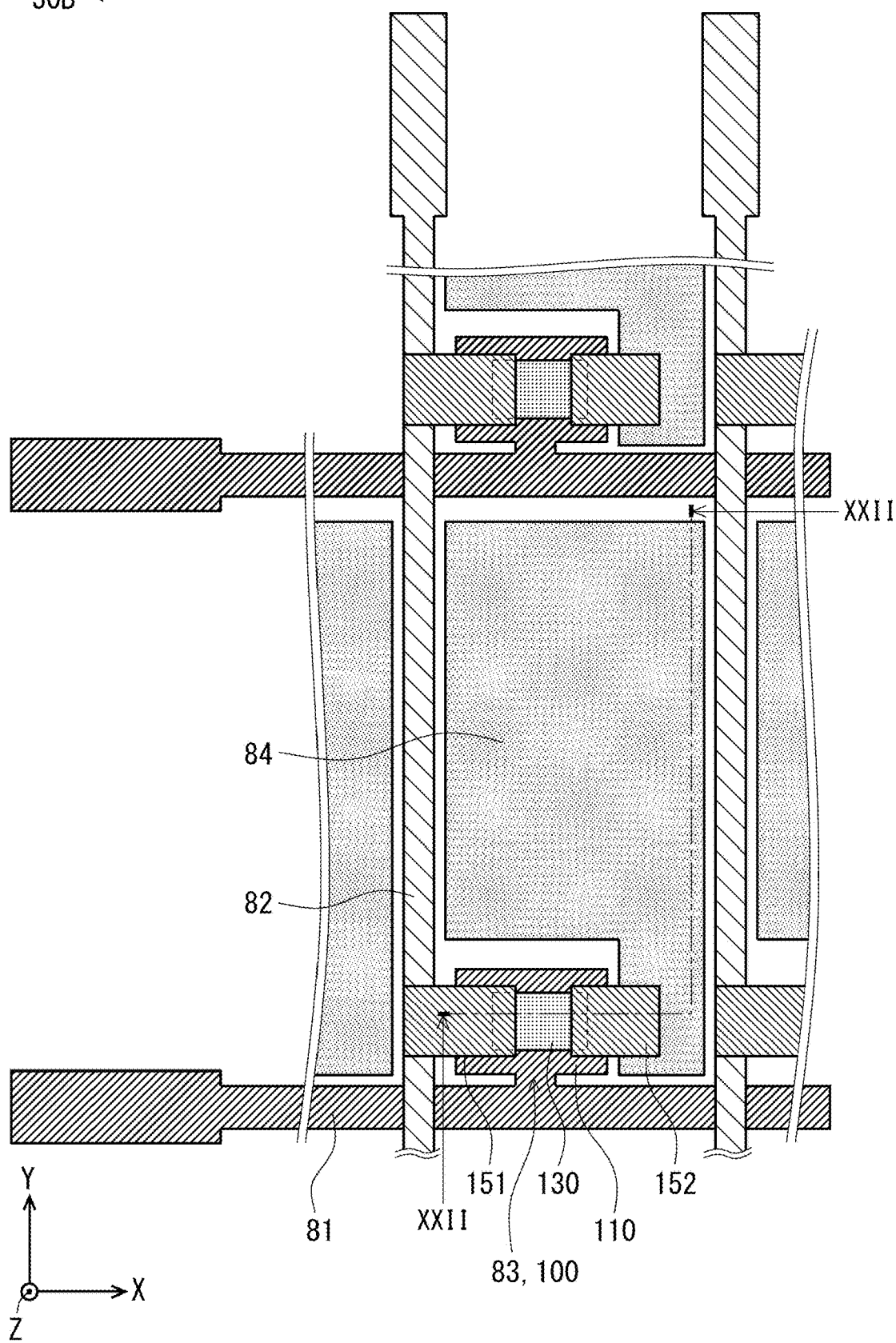
FIG. 21 is a plan view for illustrating a configuration of a TFT substrate according to a second embodiment.
Figure 22:
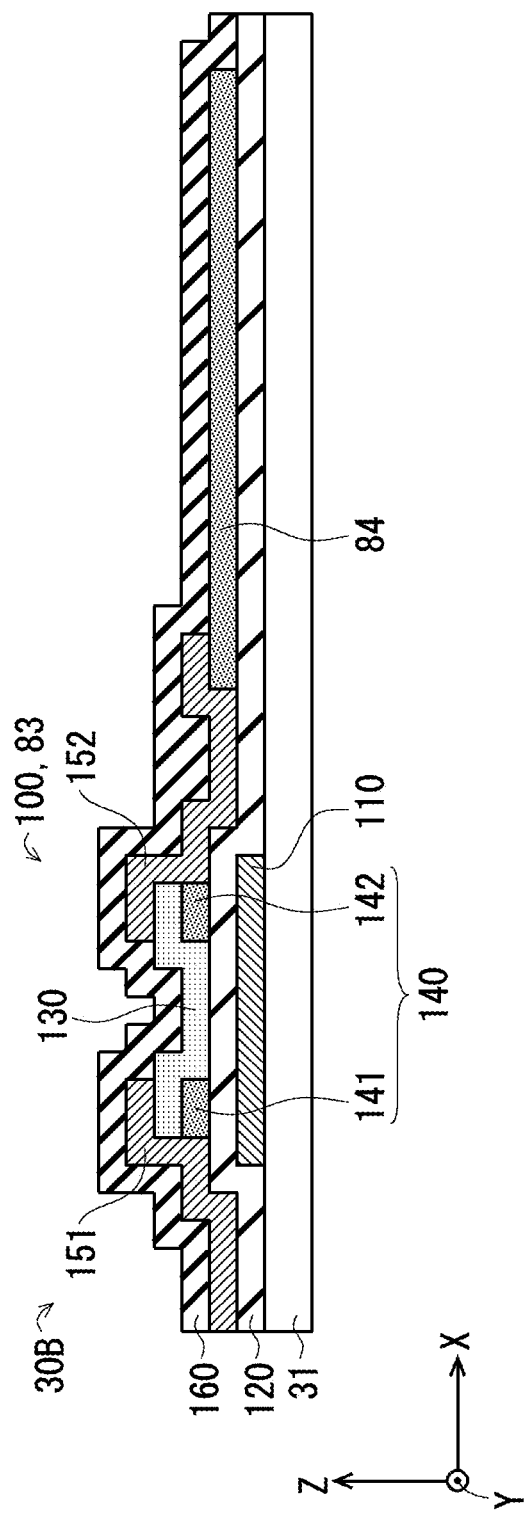
FIG. 22 is a cross-sectional view taken along the line XXII-XXII in FIG. 21.

FIG. 21 is a plan view for illustrating a configuration of a TFT substrate 30B according to a second embodiment, and FIG. 22 is a cross-sectional view taken along the line XXII-XXII in FIG. 21. Note that, an XYZ orthogonal coordinate system is also illustrated in each of FIG. 21 and FIG. 22. Further, in FIG. 21, for the sake of better understanding of the plan view, hatching is employed. In the following, components described in the first embodiment are denoted by the reference symbols used in the first embodiment, and redundant description will be omitted.

As illustrated in FIG. 21 and FIG. 22, in the TFT substrate 30B, the pixel TFT 83 is formed of the TFT 100, and the drain electrode 152 of the TFT 100 is electrically connected to the pixel electrode 84. The pixel electrode 84 is arranged on the gate insulating film 120, that is, arranged on the same layer as the lower semiconductor layer 140.

The pixel electrode 84 is formed of the same oxide semiconductor as the lower semiconductor layer 140. Here, the pixel electrode 84 and the lower semiconductor layer 140 are assumed to be formed of an oxide semiconductor lowered in resistance. However, this is not a restrictive example.

Note that, in a case where the TFT of the drive circuit (e.g., the transistors T1 to T3 of the drive voltage generation circuit SC of FIG. 3) is formed of the TFT 100, the lower semiconductor layer 140 of the TFT 100 may be formed of an oxide semiconductor lowered in resistance.

The TFT substrate 30B can form the liquid crystal panel 11 and the liquid crystal display device 10 in place of the TFT substrate 30. The TFT substrate 30B is applicable to any of a TN mode, an in-plane switching mode, and an FFS mode, and is further applicable to another mode as well.

<Manufacturing Method of TFT Substrate>

Figure 23:
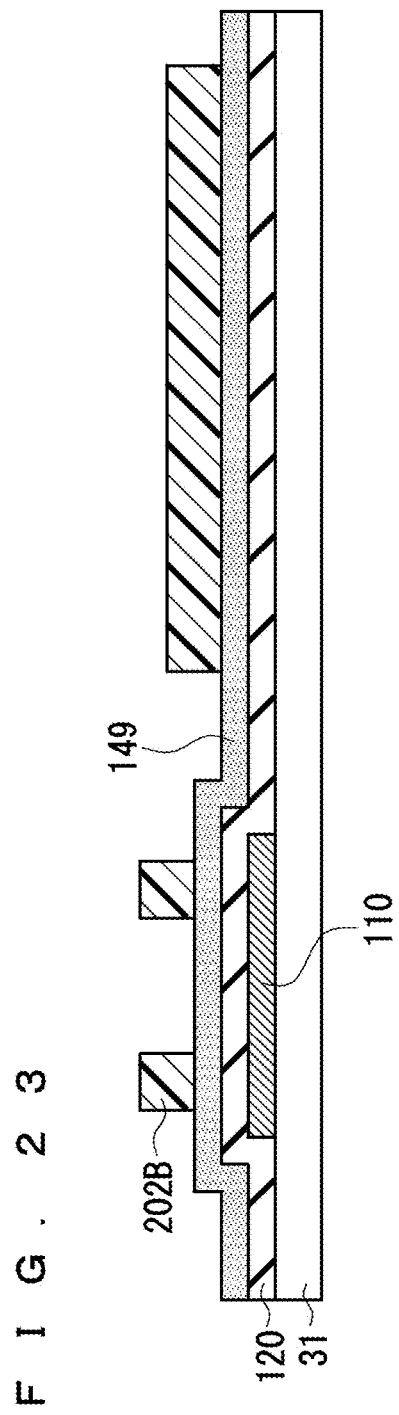
FIG. 23 is a cross-sectional view for illustrating a manufacturing method of the TFT substrate according to the second embodiment.
Figure 24:
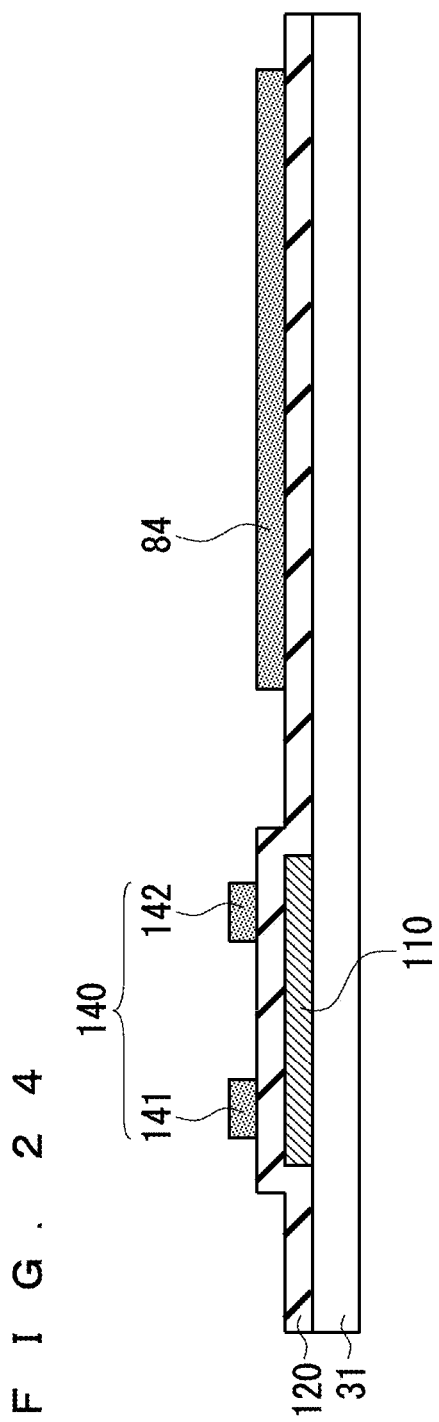
FIG. 24 is a cross-sectional view for illustrating a manufacturing method of the TFT substrate according to the second embodiment.

FIG. 23 and FIG. 24 are cross-sectional views for illustrating a manufacturing method of the TFT substrate 30B. Firstly, with a manufacturing method similar to that of the first embodiment, for example, the above-mentioned configuration of FIG. 11 is obtained.

After that, a photoresist is applied to an entire surface on the semiconductor film 149, and the photoresist is patterned with a photolithography technology. With this, as illustrated in FIG. 23, a patterning mask 202B having a pattern for the lower semiconductor layer 140 and a pattern for the pixel electrode 84 is formed. As the photoresist, for example, a novolak positive photosensitive resin may be used. The thickness of the photoresist is, for example, approximately 1.5 μm.

Then, wet etching is performed on the substrate 31 reaching a state in which the patterning mask 202B is formed (refer to FIG. 23) using a solution containing nitric acid or oxalic acid. At this time, the patterning mask 202B functions as an etching mask, and thus the lower semiconductor layer 140 and the pixel electrode 84 are simultaneously formed of the semiconductor film 149 (refer to FIG. 24). After that, the patterning mask 202B is removed using an amine-based resist stripper liquid (refer to FIG. 24).

Next, low resistance treatment is performed on the lower semiconductor layer 140 and the pixel electrode 84. Ultraviolet irradiation treatment is performed as the low resistance treatment. For example, light having a wavelength of 450 nm or less and intensity of 1 mW/cm$^2$ or more is radiated for 60 sec or more. Alternatively, as the low resistance treatment, a dry etching treatment may be used.

Here, when a partial pressure of oxygen is lowered at the time of forming the semiconductor film 149 (specifically, an oxide semiconductor film) for the lower semiconductor layer 140 and the pixel electrode 84, resistance of the semiconductor film 149 can be lowered. In this case, separate low resistance treatment need not be performed.

After that, using a process similar to that of the first embodiment (refer to FIG. 14 to FIG. 19), the TFT substrate 30B having a configuration illustrated in FIG. 22 can be obtained.

<Effects>

The TFT substrate 30B includes the TFT 100, and hence effects similar to those of the first embodiment can be obtained.

Particularly, the TFT substrate 30B includes the TFT 100 as the pixel TFT 83. Further, in the TFT substrate 30B, the pixel electrode 84 is electrically connected to the drain electrode 152 of the TFT 100, and is formed of the same oxide semiconductor as the lower semiconductor layer 140 of the TFT 100.

Further, as in the above, in a process of forming the lower semiconductor layer 140, the semiconductor film 149 is patterned, thereby forming the pixel electrode 84 together with the lower semiconductor layer 140.

In this manner, when the pixel electrode 84 is formed of the same material as the lower semiconductor layer 140, the pixel electrode 84 can be patterned simultaneously with the lower semiconductor layer 140. With this, the number of patterning processes can be reduced, and the manufacturing cost can be reduced. As a result, the TFT substrate 30B and the liquid crystal display device 10 can be provided inexpensively.

Third Embodiment

<Configuration of TFT>

Figure 25:
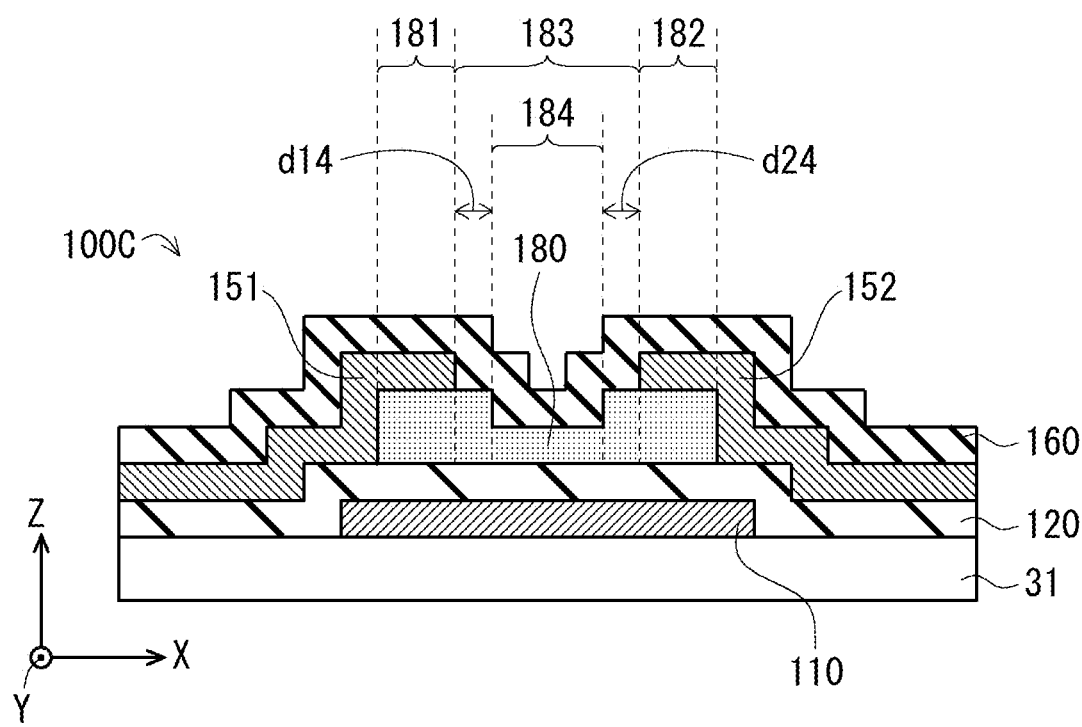
FIG. 25 is a plan view for illustrating a configuration of a TFT substrate according to a third embodiment.

FIG. 25 is a cross-sectional view for illustrating a configuration of a TFT 100C according to a third embodiment. Note that, an XYZ orthogonal coordinate system is also illustrated in FIG. 25. In the following, components described in the first and second embodiments are denoted by the reference symbols used in the first and second embodiments, and redundant description will be omitted.

The TFT 100C is applied to the above-mentioned TFT substrate 30, and can thereby form the liquid crystal panel 11 and the liquid crystal display device 10. Note that, the TFT 100C is applicable to both of the pixel TFT 83 (refer to FIG. 3) and the TFT of the drive circuit (e.g., the transistors T1 to T3 of the drive voltage generation circuit SC).

As illustrated in FIG. 25, the TFT 100C includes an oxide semiconductor layer 180. The oxide semiconductor layer 180 is arranged in place of the oxide semiconductor layer 130 and the lower semiconductor layer 140 in the TFT 100 of FIG. 5. Other configuration of the TFT 100C is the same as that of the TFT 100.

The oxide semiconductor layer 180 is formed of, for example, similarly to the oxide semiconductor layer 130 (refer to FIG. 5), an InGaZnO-based oxide semiconductor. An InGaZnO film that forms the oxide semiconductor layer 180 may have an amorphous structure.

As illustrated in FIG. 25, the oxide semiconductor layer 180 includes a source connection region 181 in contact with the source electrode 151, a drain connection region 182 in contact with the drain electrode 152, and a channel region 183 being a region between the source connection region 181 and the drain connection region 182.

Particularly, the channel region 183 has a thin portion 184 that is thinner than the source connection region 181 and the drain connection region 182. For example, the thickness of the source connection region 181 and the drain connection region 182 is 80 nm, and the thickness of the thin portion 184 of the channel region 183 is 40 nm. However, this is not a restrictive example. For example, it is desirable that the thickness of the source connection region 181 be larger than the sum (130 nm) of penetration depth (75 nm) of light and a diffusion length (55 nm) of holes. The same also applies to the thickness of the drain connection region 182. Note that, the thickness of the source connection region 181 may be different from the thickness of the drain connection region 182.

In the X direction in FIG. 25, the dimension of the thin portion 184 is shorter than the dimension of the entire channel region 183. In FIG. 25, the thin portion 184 is located at the center of the channel region 183. That is, assuming that the distance between the thin portion 184 and the source electrode 151 is d14 and the distance between the thin portion 184 and the drain electrode 152 is d24, d14=d24 holds. In contrast, d14≈d24 may also hold. Note that, it is desirable that at least one of d14 and d24 be a diffusion length of holes or more. In such a case, the thin portion 184 of the channel region 183 is distant from the source connection region 181 by a diffusion length of holes or more. Alternatively, the thin portion 184 is distant from the drain connection region 182 by a diffusion length of holes or more.

<Manufacturing Method of TFT>

Figure 26:
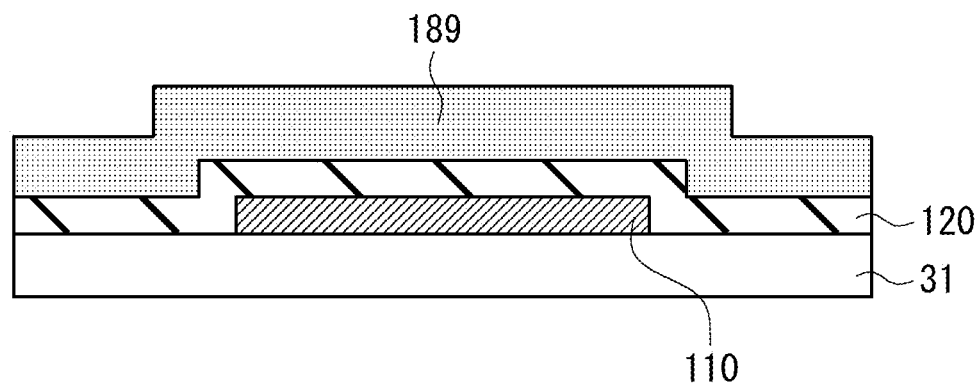
FIG. 26 is a cross-sectional view for illustrating a manufacturing method of a TFT according to the third embodiment.
Figure 27:
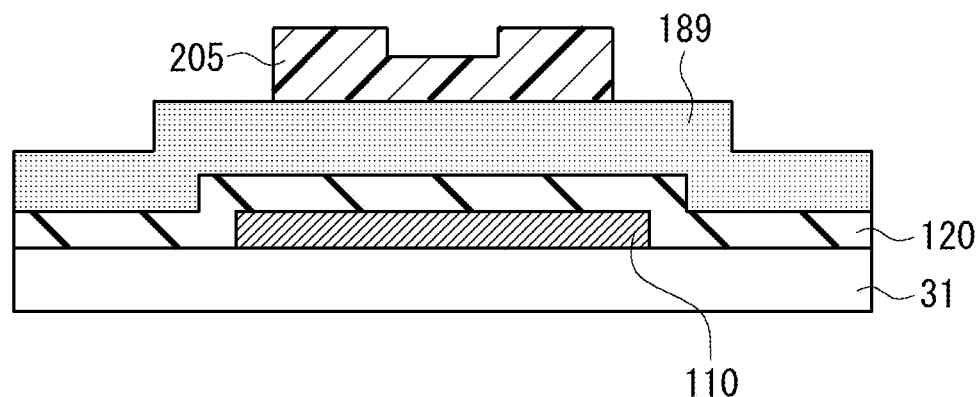
FIG. 27 is a cross-sectional view for illustrating a manufacturing method of the TFT according to the third embodiment
Figure 28:
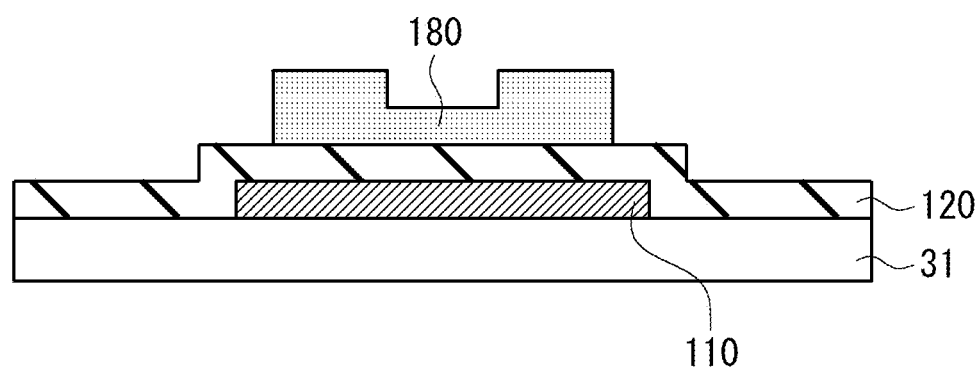
FIG. 28 is a cross-sectional view for illustrating a manufacturing method of the TFT according to the third embodiment.

FIG. 26 to FIG. 28 are cross-sectional views for illustrating a manufacturing method of the TFT 100C. Firstly, with a manufacturing method similar to that of the first embodiment, for example, the above-mentioned configuration of FIG. 10 is obtained.

Next, as illustrated in FIG. 26, an oxide semiconductor layer 189 for the oxide semiconductor layer 180 is formed on an entire surface on the gate insulating film 120. The thickness of the oxide semiconductor film 189 is, for example, 80 nm. The oxide semiconductor film 189 is, for example, a film of an InGaZnO-based oxide semiconductor. An InGaZnO film that forms the oxide semiconductor film 189 may have an amorphous structure.

For example, the oxide semiconductor film 189 is formed with a DC sputtering method using an InGaZnO target $[In_2O_3 \cdot (Ga_2O_3) \cdot (ZnO)_2]$ having an atomic composition ratio of In:Ga:Zn:O=1:1:1:4. As described in the first embodiment, as a sputtering gas, for example, it is desirable to use a mixed gas in which a partial pressure ratio of 10% of an $O_2$ gas is added to an Ar gas.

Next, a photoresist is applied to an entire surface on the oxide semiconductor film 189, and the photoresist is patterned with a photolithography technology. With this, as illustrated in FIG. 27, a patterning mask 205 for the oxide semiconductor layer 180 is formed. As the photoresist, for example, a novolak positive photosensitive resin may be used. The thickness of the photoresist is, for example, approximately 1.5 μm.

For example, exposure of the photoresist to light with a halftone method can form the patterning mask 205 having a two-level thickness. Specifically, as illustrated in FIG. 27, in the patterning mask 205, a portion corresponding to the thin portion 184 of the channel region 183 is formed to be thinner than other portions.

Then, wet etching is performed on the substrate 31 reaching a state in which the patterning mask 205 is formed (refer to FIG. 27) using a solution containing nitric acid or oxalic acid. At this time, the patterning mask 205 functions as an etching mask, and thus the oxide semiconductor layer 180 is formed of the oxide semiconductor film 189. Here, the thickness of the oxide semiconductor layer 180 is depended upon the thickness of the patterning mask 205. For this reason, the thin portion 184 is formed in the channel region 183 (refer to FIG. 28).

After that, the patterning mask 205 is removed using an amine-based resist stripper liquid (refer to FIG. 28).

After that, using a process similar to that of the first embodiment (refer to FIG. 17 to FIG. 19), the TFT 100C having a configuration illustrated in FIG. 25 can be obtained.

<Effects>

As in the above, the TFT 100C includes the gate electrode 110, the gate insulating film 120, the oxide semiconductor layer 180, the source electrode 151, and the drain electrode 152. More specifically, the gate insulating film 120 covers the gate electrode 110. The oxide semiconductor layer 180 is opposed to the gate electrode 110 with intermediation of the gate insulating film 120. The source electrode 151 and the drain electrode 152 come in contact with the oxide semiconductor layer 180.

The oxide semiconductor layer 180 includes the source connection region 181 in contact with the source electrode 151, the drain connection region 182 in contact with the drain electrode 152, and the channel region 183 being a region between the source connection region 181 and the drain connection region 182. The channel region 183 has the thin portion 184 that is thinner than the source connection region 181 and the drain connection region 182. The thin portion 184 of the channel region 183 is distant from the source connection region 181 or the drain connection region 182 by a diffusion length of holes or more.

Accordingly, in the oxide semiconductor layer 180, at least one of the source connection region 181 and the drain connection region 182 is thicker than the thin portion 184 of the channel region 183. For example, a case where the source connection region 181 is thicker than the thin portion 184 is assumed. Even in a case where a surface of the oxide semiconductor layer 180 is irradiated with light (such as light from the backlight device 14) in the vicinity of the source electrode 151, photoexcited holes can be prevented from reaching the gate insulating film 120. With this, holes to be trapped in an interface between the oxide semiconductor layer 180 and the gate insulating film 120 and holes to be trapped inside the gate insulating film 120 can be reduced. Since trapped holes may cause a threshold voltage of a TFT to shift to the negative side, such threshold voltage shift can be prevented. This holds the same for a case where the drain connection region 182 is thicker than the thin portion 184. As a result, a threshold voltage is stabilized even under light irradiation, and high reliability is obtained.

On the other hand, the channel region 183 has the thin portion 184, and therefore, as compared to a configuration in which the thin portion 184 is absent, an off current can be reduced to be low. Also in this respect, high reliability is obtained.

Further, according to the third embodiment, the liquid crystal display device 10 includes the TFT substrate 30 having the TFT 100C, the counter substrate 40 opposed to the TFT substrate 30, and the liquid crystal layer 50 provided between the TFT substrate 30 and the counter substrate 40. That is, such a highly reliable TFT 100C is applied as in the above, and hence the liquid crystal display device 10 can provide high reliability, high resolution, a narrow frame, and the like similarly to the first embodiment.

Incidentally, according to the above-mentioned manufacturing method, a manufacturing method of the TFT 100C includes a process of forming the gate electrode 110, a process of forming the gate insulating film 120, a process of forming the oxide semiconductor layer 180, and a process of forming the source electrode 151 and the drain electrode 152.

In a process of forming the gate electrode 110, the first conductive film 119 is formed on the substrate 31 and then the first conductive film 119 is patterned, thereby forming the gate electrode 110. In a process of forming the gate insulating film 120, the gate insulating film 120 is formed so as to cover the gate electrode 110.

In a process of forming the oxide semiconductor layer 180, the oxide semiconductor film 189 is formed on the gate insulating film 120 and then the oxide semiconductor film 189 is patterned, thereby forming the oxide semiconductor layer 180 so as to be opposed to the gate electrode 110 with intermediation of the gate insulating film 120.

Here, in a process of forming the oxide semiconductor layer 180, the oxide semiconductor film 189 is patterned such that the oxide semiconductor layer 180 includes the source connection region 181 in contact with the source electrode 151 (more specifically, to be hound to come in contact with the source electrode 151 after the formation of the source electrode 151), the drain connection region 182 in contact with the drain electrode 152 (more specifically, to be bound to come in contact with the drain electrode 152 after the formation of the drain electrode 152), and the channel region 183 being a region between the source connection region 181 and the drain connection region 182 and having the thin portion 184 thinner than the source connection region 181 and the drain connection region 182. In addition, at that time, the oxide semiconductor film 189 is patterned such that the thin portion 184 of the channel region 183 is distant from the source connection region 181 or the drain connection region 182 by a diffusion length of holes or more.

Further, in a process of forming the oxide semiconductor layer 180, the patterning mask 205 for the oxide semiconductor layer 180 is formed such that a portion corresponding to the thin portion 184 of the channel region 183 is thinner than other portions. Then, the oxide semiconductor film 189 is etched using the patterning mask 205.

In a process of forming the source electrode 151 and the drain electrode 152, the second conductive film 159 is formed so as to cover the oxide semiconductor layer 180 and then the second conductive film 159 is patterned, thereby forming the source electrode 151 and the drain electrode 152 so as to come in contact with the oxide semiconductor layer 180.

Accordingly, the TFT 100C can be manufactured with three times of patterning.

Here, the oxide semiconductor layer 180 corresponds to a stacked body of the lower semiconductor layer 140 and the oxide semiconductor layer 130 according to the first embodiment. In view of this respect, according to the third embodiment, a configuration corresponding to the above-mentioned stacked body can be formed with patterning of a single time. Further, in the first embodiment, the lower semiconductor layer 140 may be exposed to air between a process of forming the lower semiconductor layer 140 and a process of forming the oxide semiconductor layer 130. In contrast, according to the third embodiment, the oxide semiconductor layer 180 can be formed avoiding such air exposure. For this reason, generation of defects due to air exposure can be prevented.

Note that, various technologies of the first and second embodiments may be adopted in the third embodiment. With this, effects relating to the adopted technology can be obtained.

<Supplementary Note>

Note that, in the present invention, each of the embodiments may be freely combined, and each of the embodiments may be modified or omitted as appropriate within the scope of the invention.

The present invention has been described in detail, but the above description is in all aspects illustrative, and the present invention is not limited thereto. It is understood that numerous unillustrated modified examples are assumable without departing from the scope of the present invention.

EXPLANATION OF REFERENCE SIGNS 10 liquid crystal display device, 30, 30B TFT substrate, 31 substrate, 40 counter substrate, 50 liquid crystal layer, 83 pixel TFT, 84 pixel electrode, 100, 100C TFT, 110 gate electrode, 119 first conductive film, 120 gate insulating film, 130, 180 oxide semiconductor layer, 139, 189 oxide semiconductor film, 140 lower semiconductor layer, 149 semiconductor film, 151 source electrode, 152 drain electrode, 171 source overlapping region, 172 drain overlapping region, 173 source-drain inner region, 181 source connection region, 182 drain connection region, 183 channel region, 184 thin portion, 205 patterning mask

The invention claimed is:

1. A thin film transistor comprising:
a gate electrode;
a gate insulating film that covers the gate electrode;
an oxide semiconductor layer provided above the gate insulating film and opposed to the gate electrode with intermediation of the gate insulating film;
a lower semiconductor layer partially provided between the oxide semiconductor layer and the gate insulating film so as to be opposed to the gate electrode; and
a source electrode and a drain electrode that are provided above the oxide semiconductor layer and are brought into contact with the oxide semiconductor layer, wherein
the lower semiconductor layer is present in at least one of a source overlapping region where the oxide semiconductor layer overlaps the source electrode and a drain overlapping region where the oxide semiconductor layer overlaps the drain electrode, and a region where the lower semiconductor layer is absent is provided between the source overlapping region and the drain overlapping region,
a sum of a thickness of the oxide semiconductor layer and a thickness of the lower semiconductor layer is larger than a sum of penetration depth of light and a diffusion length of a hole, and
an entirety of the lower semiconductor layer falls within arrangement ranges of the source electrode and the drain electrode in a plan view.

2. The thin film transistor according to claim 1, wherein carrier density of the lower semiconductor layer is higher than carrier density of the oxide semiconductor layer.

3. The thin film transistor according to claim 1, wherein
an entirety of the oxide semiconductor layer falls within an arrangement range of the gate electrode in a plan view,
the source electrode is brought into contact with an end of the oxide semiconductor layer and extends on the gate insulating film from the end of the oxide semiconductor layer,
the drain electrode is brought into contact with another end of the oxide semiconductor layer and extends on the gate insulating film from the another end of the oxide semiconductor layer,
the source overlapping region overlaps a region where the source electrode and the end of the oxide semiconductor layer are brought into contact with each other, and
the drain overlapping region overlaps a region where the drain electrode and the another end of the oxide semiconductor layer are brought into contact with each other.

4. The thin film transistor according to claim 3, wherein
an entirety of the region where the source electrode and the end of the oxide semiconductor layer are brought into contact with each other falls within a range of the source overlapping region in the plan view, and
an entirety of the region where the drain electrode and the another end of the oxide semiconductor layer are brought into contact with each other falls within a range of the drain overlapping region in the plan view.

5. A thin film transistor substrate comprising:
a thin film transistor as a pixel transistor, wherein the thin film transistor includes:
   a gate electrode;
   a gate insulating film that covers the gate electrode;
   an oxide semiconductor layer provided above the gate insulating film and opposed to the gate electrode with intermediation of the gate insulating film;
   a lower semiconductor layer partially provided between the oxide semiconductor layer and the gate insulating film so as to be opposed to the gate electrode; and
   a source electrode and a drain electrode that are provided above the oxide semiconductor layer and are brought into contact with the oxide semiconductor layer,
the lower semiconductor layer is present in at least one of a source overlapping region where the oxide semiconductor layer overlaps the source electrode and a drain overlapping region where the oxide semiconductor layer overlaps the drain electrode, and a region where the lower semiconductor layer is absent is provided between the source overlapping region and the drain overlapping region, and
the thin film transistor substrate comprising:
a pixel electrode electrically connected to the drain electrode of the thin film transistor, the pixel electrode and the lower semiconductor layer being formed of a same oxide semiconductor,
wherein a sum of a thickness of the oxide semiconductor layer and a thickness of the lower semiconductor layer is larger than a sum of penetration depth of light and a diffusion length of a hole, and
an entirety of the lower semiconductor layer falls within arrangement ranges of the source electrode and the drain electrode in a plan view.

6. The thin film transistor substrate according to claim 5, wherein carrier density of the lower semiconductor layer is higher than carrier density of the oxide semiconductor layer.

7. The thin film transistor substrate according to claim 5, wherein
an entirety of the oxide semiconductor layer falls within an arrangement range of the gate electrode in a plan view,
the source electrode is brought into contact with an end of the oxide semiconductor layer and extends on the gate insulating film from the end of the oxide semiconductor layer,
the drain electrode is brought into contact with another end of the oxide semiconductor layer and extends on the gate insulating film from the another end of the oxide semiconductor layer,
the source overlapping region overlaps a region where the source electrode and the end of the oxide semiconductor layer are brought into contact with each other, and
the drain overlapping region overlaps a region where the drain electrode and the another end of the oxide semiconductor layer are brought into contact with each other.

8. The thin film transistor substrate according to claim 7, wherein
an entirety of the region where the source electrode and the end of the oxide semiconductor layer are brought into contact with each other falls within a range of the source overlapping region in the plan view, and
an entirety of the region where the drain electrode and the another end of the oxide semiconductor layer are brought into contact with each other falls within a range of the drain overlapping region in the plan view.

9. A liquid crystal display device comprising:
a thin film transistor substrate;
a counter substrate opposed to the thin film transistor substrate; and
a liquid crystal layer provided between the thin film transistor substrate and the counter substrate, wherein
the thin film transistor substrate includes:
a thin film transistor including:
a gate electrode;
a gate insulating film that covers the gate electrode;
an oxide semiconductor layer provided above the gate insulating film and opposed to the gate electrode with intermediation of the gate insulating film;
a lower semiconductor layer partially provided between the oxide semiconductor layer and the gate insulating film so as to be opposed to the gate electrode; and
a source electrode and a drain electrode that are provided above the oxide semiconductor layer and are brought into contact with the oxide semiconductor layer, wherein
the lower semiconductor layer is present in at least one of a source overlapping region where the oxide semiconductor layer overlaps the source electrode and a drain overlapping region where the oxide semiconductor layer overlaps the drain electrode, and a region where the lower semiconductor layer is absent is provided between the source overlapping region and the drain overlapping region, and
the thin film transistor substrate includes:
a pixel electrode electrically connected to the drain electrode of the thin film transistor, the pixel electrode and the lower semiconductor layer being formed of a same oxide semiconductor,
wherein a sum of a thickness of the oxide semiconductor layer and a thickness of the lower semiconductor layer is larger than a sum of penetration depth of light and a diffusion length of a hole, and
an entirety of the lower semiconductor layer falls within arrangement ranges of the source electrode and the drain electrode in a plan view.

10. The liquid crystal display device according to claim 9, wherein carrier density of the lower semiconductor layer is higher than carrier density of the oxide semiconductor layer.

11. The liquid crystal display device according to claim 9, wherein
an entirety of the oxide semiconductor layer falls within an arrangement range of the gate electrode in a plan view,
the source electrode is brought into contact with an end of the oxide semiconductor layer and extends on the gate insulating film from the end of the oxide semiconductor layer,
the drain electrode is brought into contact with another end of the oxide semiconductor layer and extends on the gate insulating film from the another end of the oxide semiconductor layer,
the source overlapping region overlaps a region where the source electrode and the end of the oxide semiconductor layer are brought into contact with each other, and
the drain overlapping region overlaps a region where the drain electrode and the another end of the oxide semiconductor layer are brought into contact with each other.

12. The liquid crystal display device according to claim 11, wherein
an entirety of the region where the source electrode and the end of the oxide semiconductor layer are brought into contact with each other falls within a range of the source overlapping region in the plan view, and
an entirety of the region where the drain electrode and the another end of the oxide semiconductor layer are brought into contact with each other falls within a range of the drain overlapping region in the plan view.

* * * * *